United States Patent
Chang et al.

(10) Patent No.: US 11,568,948 B2
(45) Date of Patent: Jan. 31, 2023

(54) MEMORY CIRCUIT AND METHOD OF OPERATING SAME

(71) Applicant: TAIWAN SEMICONDUCTOR MANUFACTURING COMPANY, LTD., Hsinchu (TW)

(72) Inventors: Chun-Hao Chang, Hsinchu (TW); Gu-Huan Li, Hsinchu (TW); Shao-Yu Chou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/319,582

(22) Filed: May 13, 2021

(65) Prior Publication Data
US 2022/0262446 A1    Aug. 18, 2022

Related U.S. Application Data
(60) Provisional application No. 63/149,112, filed on Feb. 12, 2021.

(51) Int. Cl.
| G11C 17/00 | (2006.01) |
| G11C 17/18 | (2006.01) |
| G11C 17/16 | (2006.01) |

(52) U.S. Cl.
CPC .............. *G11C 17/18* (2013.01); *G11C 17/16* (2013.01)

(58) Field of Classification Search
CPC ................................ G11C 17/18; G11C 17/16
USPC ........................................................... 365/96
See application file for complete search history.

(56) References Cited

U.S. PATENT DOCUMENTS

| | | | |
|---|---|---|---|
| 7,586,787 B2* | 9/2009 | Vo | G11C 16/10 365/185.23 |
| 9,711,229 B1* | 7/2017 | Rabkin | G11C 11/5635 |
| 2001/0056557 A1 | 12/2001 | Kawagoe et al. | |
| 2005/0201172 A1 | 9/2005 | Cruz et al. | |
| 2008/0080295 A1 | 4/2008 | Namekawa et al. | |
| 2013/0336078 A1* | 12/2013 | Yamamoto | G11C 7/08 365/210.1 |
| 2014/0268984 A1 | 9/2014 | Yanagisawa | |
| 2020/0342918 A1* | 10/2020 | Bringivijayaraghavan | G11C 11/412 |

FOREIGN PATENT DOCUMENTS

| CN | 102365685 | | 2/2012 |
| CN | 105934884 | * | 9/2016 |
| DE | 102009011255 A1 | | 9/2010 |
| TW | 200712861 | | 4/2007 |

OTHER PUBLICATIONS

Office Action dated May 18, 2022 for corresponding case No. TW 11120490380. (pp. 1-6).
Office Action dated Oct. 16, 2021 for corresponding case No. DE 10 2021 112 998.2 (pp. 1-7).

* cited by examiner

*Primary Examiner* — Huan Hoang
(74) *Attorney, Agent, or Firm* — Hauptman Ham, LLP

(57) ABSTRACT

A memory circuit includes a non-volatile memory cell, a sense amplifier coupled to the non-volatile memory cell, and configured to generate a first output signal, and a detection circuit coupled to the sense amplifier and the non-volatile memory cell. The detection circuit is configured to latch the first output signal and disrupt a current path between the non-volatile memory cell and the sense amplifier.

20 Claims, 19 Drawing Sheets

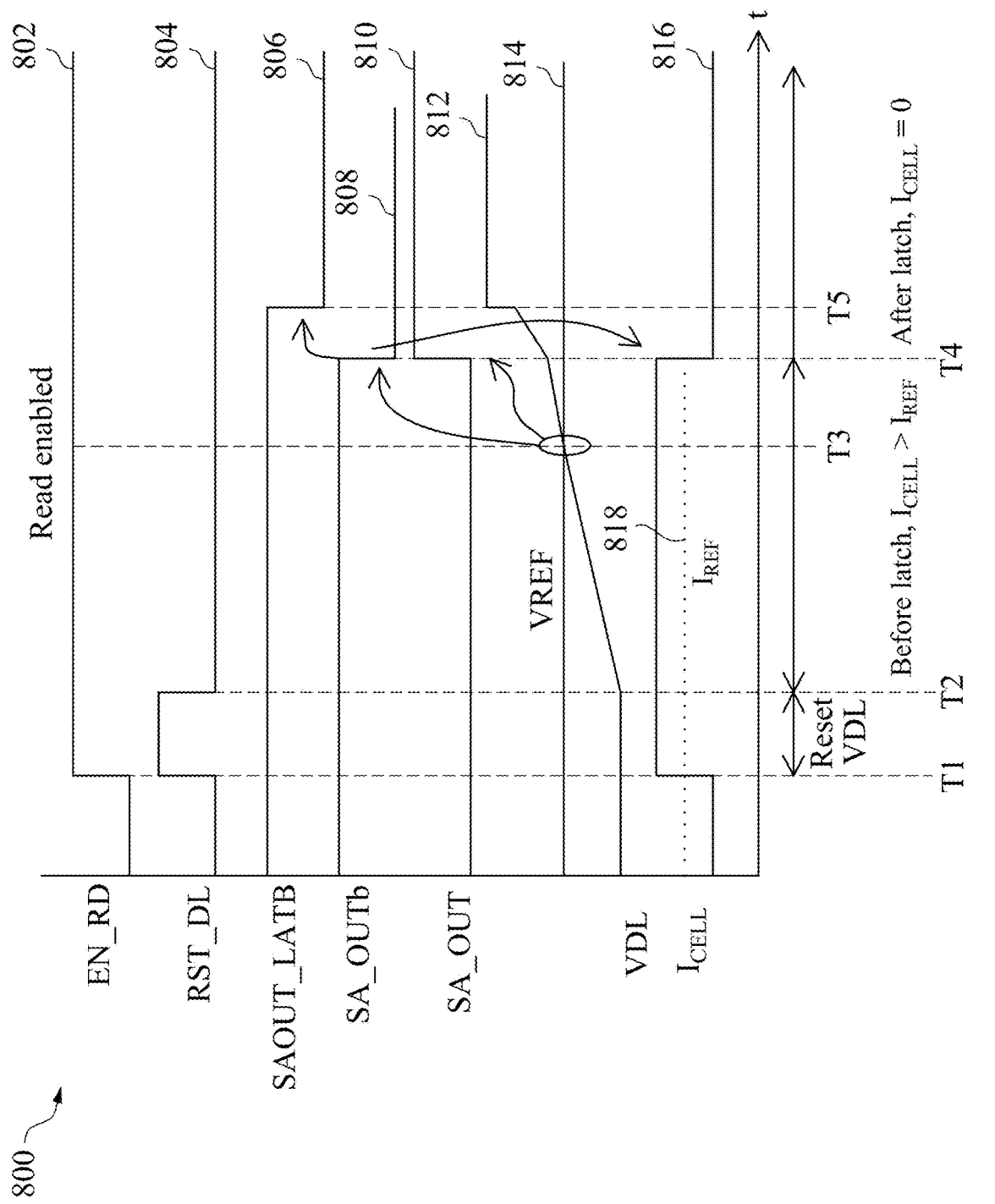

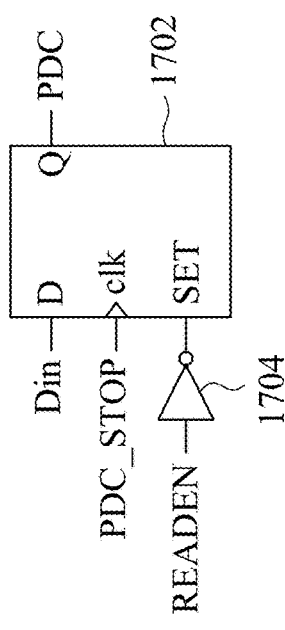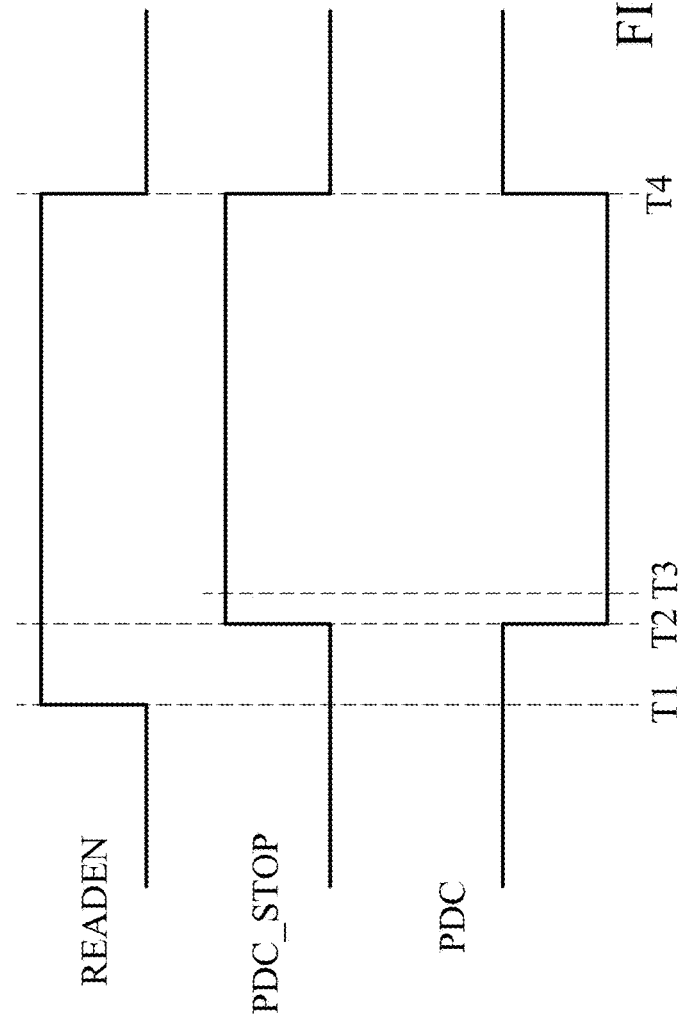
FIG. 17A
FIG. 17B

MEMORY CIRCUIT AND METHOD OF OPERATING SAME

PRIORITY CLAIM

This application claims the benefit of U.S. Provisional Application No. 63/149,112, filed Feb. 12, 2021, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a timing diagram of waveforms of a circuit, such as the circuit in FIGS. 7A-7C, in accordance with some embodiments.

FIG. 17A is a block diagram of a PDC generator circuit, in accordance with some embodiments.

FIG. 17B is a timing diagram of waveforms of a PDC generator circuit, in accordance with some embodiments.

DETAILED DESCRIPTION

Figure 1:
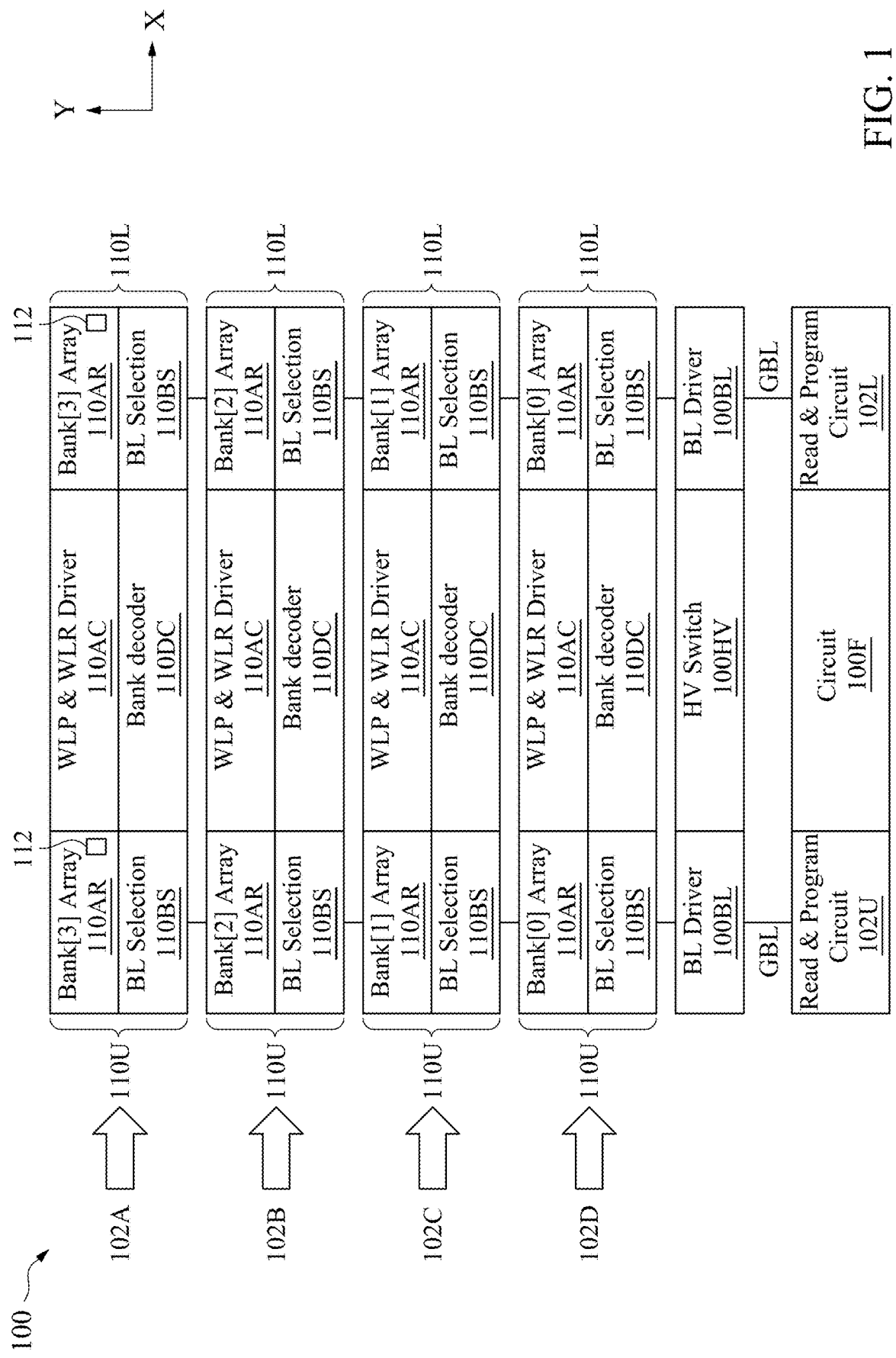
FIG. 1 is a circuit diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a non-volatile memory cell, a sense amplifier and a detection circuit. In some embodiments, the non-volatile memory cell is coupled to a word line. In some embodiments, the sense amplifier is coupled to the non-volatile memory cell. In some embodiments, the sense amplifier is configured to generate a first output signal. In some embodiments, the first output signal corresponds to data stored in the non-volatile memory cell.

In some embodiments, the detection circuit is coupled to the sense amplifier and the non-volatile memory cell. In some embodiments, the detection circuit is configured to latch the first output signal. In some embodiments, the detection circuit is configured to disrupt a current path between the non-volatile memory cell and the sense amplifier after the first output signal is latched.

In some embodiments, by disrupting the current path between the non-volatile memory cell and the sense amplifier, the memory cell current flowing through the non-volatile memory cell becomes 0. In some embodiments, by causing the memory cell current to be 0, current resistance (IR) drops along the word line are reduced thereby reducing power consumption of the memory circuit compared with other approaches, while still being able to correctly read the data stored in the non-volatile memory cell since the first output signal was previously latched.

FIG. 1 is a block diagram of a memory circuit 100, in accordance with some embodiments.

FIG. 1 is simplified for the purpose of illustration. In some embodiments, memory circuit 100 includes various elements in addition to those depicted in FIG. 1 or is otherwise arranged so as to perform the operations discussed below.

Memory circuit 100 is an IC that includes memory partitions 102A-102D, bit line (BL) drivers 100BL, a global high voltage (HV) switch circuit 100HV, read/program circuits 102U/102L and circuit 100F.

Each memory partition 102A-102D includes memory banks 110U and 110L adjacent to a word line program/word line read (WLP/WLR) driver circuit 110AC, also referred to as an activation circuit 110AC in some embodiments. Each memory bank 110U and 110L includes a memory cell array 110AR and a BL selection circuit 110BS, and each WLP/WLR driver circuit 110AC includes a bank decoder circuit 110DC.

A memory partition, e.g., a memory partition 102A-102D, is a portion of memory circuit 100 that includes a subset of non-volatile (NVM) devices (not shown in FIG. 1) and adjacent circuits configured to selectively access the subset of NVM devices in program and read operations. In the embodiment depicted in FIG. 1, memory circuit 100 includes a total of four partitions. In some embodiments, memory circuit 100 includes a total number of partitions greater or fewer than four.

BL driver 100BL, is an electronic circuit configured to control access to one or more electrical paths, e.g., bit lines, to each NVM device of the corresponding memory bank 110U or 110L of each memory partition 102A-102D, e.g., by generating one or more bit line signals. In some embodiments, BL driver 100BL is a global bit line driver circuit.

Global HV switch circuit 100HV is an electronic circuit configured to output HV power signals to one or more NVM devices. In some embodiments, each HV power signal has a voltage level VP (not shown in FIG. 1) corresponding to a program operation on an NVM device and a voltage level VR corresponding to a read operation on an NVM device. In some embodiments, voltage level VP has a magnitude greater than that of voltage level VR. In some embodiments, each HV switch circuit 100HV is configured to output the HV power signal having voltage levels VP and VR to the corresponding memory bank 110U or 110L of each memory partition 102A-102D.

Each of read/program circuit 102U and 102L is a circuit configured to perform read and/or program operations of one or more memory cells in memory partition 102A, 102B, 102C or 102D. In some embodiments, each of read/program circuits 102U and 102L includes a read circuit configured to perform read operations of one or more memory cells in memory partition 102A, 102B, 102C or 102D. In some embodiments, read/program circuit 102U or 102L includes a detection circuit (not shown in FIG. 1), e.g., a sense amplifier, configured to determine an absolute and/or relative voltage and/or current level of one or more signals received from a selected NVM device.

In some embodiments, each of read/program circuit 102U and 102L is coupled to each memory bank 110U and 110L by a corresponding global bit line GBL.

In some embodiments, each of read/program circuits 102U and 102L includes a program circuit configured to perform programming operations of one or more memory cells in memory partition 102A, 102B, 102C or 102D.

Circuit 100F is an electronic circuit configured to control some or all of program and read operations on each memory partition 102A-102D, e.g., by generating and/or outputting one or more control and/or enable signals. In some embodiments, circuit 100F includes a control circuit (not shown). In various embodiments, circuit 100F includes one or more analog circuits configured to interface with memory partitions 102A-102D, cause data to be programmed in one or more NVM devices, and/or use data received from one or more NVM devices in one or more circuit operations. In some embodiments, circuit 100F includes one or more global address decode or pre-decoder circuits (shown in FIG. 14) configured to output one or more address signals to the WLP/WLR driver circuit 110AC of each memory partition 102A-102D.

Each WLP/WLR driver circuit 110AC is an electronic circuit including the corresponding bank decoder circuit 110DC configured to receive the one or more address signals. Each WLP/WLR driver circuit 110AC is configured to generate program word line signals on corresponding program word lines WLP and read word line signals on corresponding read word lines WLR.

Each bank decoder circuit 110DC is configured to generate enable signals corresponding to adjacent subsets of NVM devices identified by the one or more address signals. In some embodiments, the adjacent subsets of NVM devices correspond to columns of NVM devices. In some embodiments, each bank decoder circuit 110DC is configured to generate each enable signal as a complementary pair of enable signals. In some embodiments, each bank decoder circuit 110DC is configured to output the enable signals to the adjacent memory banks 110U and 110L of the corresponding memory partition 102A-102D.

Each memory bank 110U and 110L includes the corresponding BL selection circuit 110BS configured to selectively access one or more bit lines (not shown) coupled to adjacent subsets of NVM devices of the corresponding memory cell array 110AR responsive to BL driver 100BL, e.g., based on one or more BL control signals. In some embodiments, the adjacent subsets of NVM devices correspond to rows of NVM devices.

Each memory bank 110U and 110L includes the corresponding memory cell array 110AR including NVM devices 112 configured to be accessed in program and read operations by the adjacent BL selection circuit 110BS and the adjacent WLP/WLR driver circuit 110AC.

Each memory cell array 110AR includes an array of NVM devices 112 having N rows and M columns, where M and N are positive integers. The rows of cells in memory cell array 110AR are arranged in a first direction X. The columns of cells in memory cell array 110AR are arranged in a second direction Y. The second direction Y is different from the first direction X. In some embodiments, the second direction Y is perpendicular to the first direction X.

NVM device 112 is shown in memory bank 110U and 110L of memory partition 102A. For ease of illustration, NVM device 112 is not shown in memory bank 110U and 110L of memory partitions 102B, 102C and 102D.

NVM device 112 is an electrical, electromechanical, electromagnetic, or other device configured to store bit data represented by logical states. At least one logical state of an NVM device 112 is capable of being programmed in a write operation and detected in a read operation. In some embodiments, a logical state corresponds to a voltage level of an electrical charge stored in a given NVM device 112. In some embodiments, a logical state corresponds to a physical property, e.g., a resistance or magnetic orientation, of a component of a given NVM device 112.

In various embodiments, NVM devices 112 include one or more one-time programmable (OTP) memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, an NVM device 112 is an OTP memory device including one or more memory cells discussed below with respect to FIG. 3.

Other configurations of memory circuit 100 are within the scope of the present disclosure.

Figure 2:
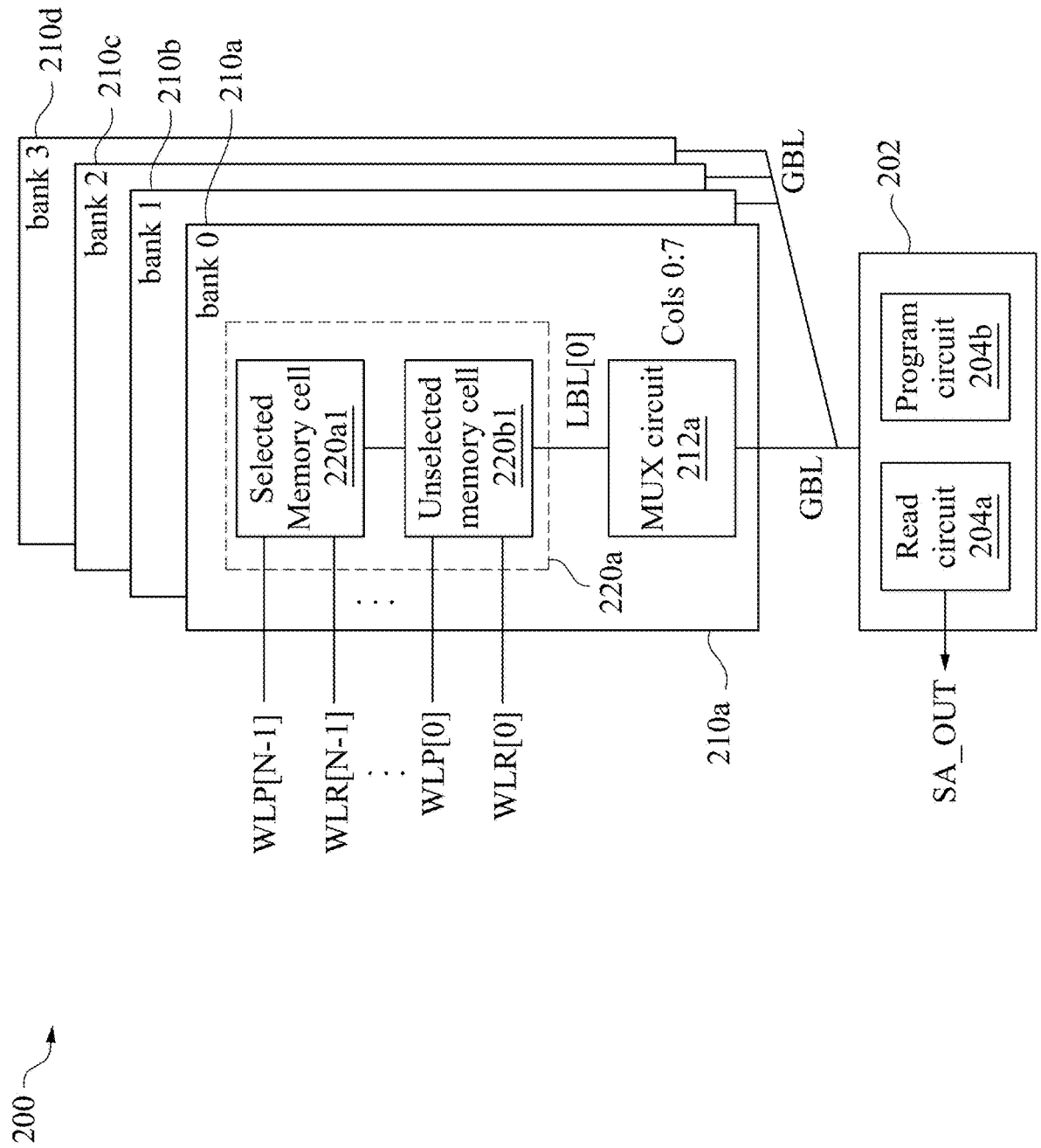
FIG. 2 is a circuit diagram of a memory circuit, in accordance with some embodiments.

FIG. 2 is a circuit diagram of a memory circuit 200, in accordance with some embodiments.

Memory circuit 200 is an embodiment of a portion of memory circuit 100 of FIG. 1, and similar detailed description is therefore omitted. For example, memory circuit 200 is an embodiment of the upper portion (e.g., 110U or 102U) or lower portion (e.g., 110L or 102L) of memory circuit 100 of FIG. 1.

Memory circuit 200 includes a read/program circuit 202 coupled to a set of memory banks 210. In some embodiments, read/program circuit 202 is an embodiment of read/program circuit 102U or 102L of memory circuit of FIG. 1, memory bank 210a is an embodiment of memory bank 110U or 110L of memory partition 102A of FIG. 1, memory bank 210b is an embodiment of memory bank 110U or 110L of memory partition 102B of FIG. 1, memory bank 210c is an embodiment of memory bank 110U or 110L of memory partition 102C of FIG. 1, and memory bank 210d is an embodiment of memory bank 110U or 110L of memory partition 102D of FIG. 1, and similar detailed description is therefore omitted.

Read/program circuit 202 is coupled to the set of memory banks 210 by a global bit line GBL. Read/program circuit 202 is coupled to each memory bank 210a, 210b, 210c and 210d of the set of memory banks 210 by the global bit line GBL.

Read/program circuit 202 includes a read circuit 204a and a program circuit 204b. Read circuit 204a is configured to perform read operations of one or more memory cells in the set of memory banks 210. In some embodiments, read circuit 204a is configured to perform read operations of a selected memory cell (e.g., memory cell 220a1) in memory cell array 220a. In some embodiments, read circuit 204a includes a sense amplifier and a detection circuit (shown in FIGS. 4-7B, 9 & 11-13) configured to determine a stored value in one or more memory cells in the set of memory banks 210.

Program circuit 204b is configured to perform programming operations of one or more memory cells in the set of memory banks 210. In some embodiments, program circuit 204b is configured to perform programming operations of a selected memory cell (e.g., memory cell 220a1) in memory cell array 220a.

The set of memory banks 210 include at least memory bank 210a, 210b, 210c or 210d. Each memory bank 210a, 210b, 210c or 210d includes a corresponding memory cell array 220a, 220b, 220c or 220d (collectively referred to as "a set of memory cell arrays 220") and a corresponding multiplexer 212a, 212b, 212c or 212d (collectively referred to as "a set of multiplexers 212").

For ease of illustration, memory cell arrays 220b, 220c and 220d and multiplexers 212b, 212c and 212d are not shown in FIG. 2.

In some embodiments, memory cell array 210a is an embodiment of memory cell array 110AR of memory bank 110U or 110L of memory partition 102A of FIG. 1, memory cell array 210b is an embodiment of memory cell array 110AR of memory bank 110U or 110L of memory partition 102B of FIG. 1, memory cell array 210c is an embodiment of memory cell array 110AR of memory bank 110U or 110L of memory partition 102C of FIG. 1, and memory cell array 210d is an embodiment of memory cell array 110AR of memory bank 110U or 110L of memory partition 102D of FIG. 1, and similar detailed description is therefore omitted.

In some embodiments, multiplexer 212a is an embodiment of BL selection circuit 110BS of memory bank 110U or 110L of memory partition 102A of FIG. 1, multiplexer 212b is an embodiment of BL selection circuit 110BS of memory bank 110U or 110L of memory partition 102B of FIG. 1, multiplexer 212c is an embodiment of BL selection circuit 110BS of memory bank 110U or 110L of memory partition 102C of FIG. 1, and multiplexer 212d is an embodiment of BL selection circuit 110BS of memory bank 110U or 110L of memory partition 102D of FIG. 1, and similar detailed description is therefore omitted.

Each multiplexer 212a, 212b, 212c or 212d is coupled to read/program circuit 202 by global bit line GBL. Each multiplexer 212a, 212b, 212c or 212d of the set of multiplexers 212 is configured to selectively couple selected columns of each memory cell array 220a, 220b, 220c, 220d of the set of memory cell arrays 220 to read/program circuit 202 by global bit line GBL.

Each multiplexer 212a, 212b, 212c or 212d is coupled to each corresponding memory cell array 220a, 220b, 220c or 220d by a set of local bit lines LBL. The set of local bit lines LBL includes local bit lines [0], LBL[1], . . . , LBL[M−1].

Multiplexer 212a is coupled to columns 0 to M−1 of memory cell array 220a by corresponding local bit lines LBL[0] to LBL[M−1]. For ease of illustration, memory cell array 220a is shown with 1 column (e.g., column 0). The details of multiplexers 212b-212d are not described for brevity, but are similar to multiplexer 212a.

Multiplexer 212a is configured to selectively couple a column of local bit lines LBL[0], LBL[1], . . . , LBL[M−1] and a corresponding column 0, 1, . . . , M−1 of memory cells in memory cell array 220a to the global bit line GBL. For example, multiplexer 212a is configured to selectively couple column 0 of local bit line LBL[0] and column 0 of memory cells in memory cell array 220a to the global bit line GBL.

Column 0 of memory cell array 220 includes at least memory cell 220a1 and memory cell 220a2. For example, multiplexer 212a is configured to selectively couple column 0 of local bit line LBL[0] and memory cells 220a1 and 220a2 to the global bit line GBL.

Memory cell 220a1 is a selected memory cell and is coupled to program word line WLP[N−1] and read word line WLR[N−1]. Memory cell 220a2 is an unselected memory cell and is coupled to program word line WLP[0] and read word line WLR[0]. Each of the memory cells in column 0 of memory cell array 220 are coupled to multiplexer 212a by local bit line LBL[0], and are further coupled to the read/program circuit 202 by global bit line GBL.

During a read or program operation of a selected memory cell (e.g., memory cell 220a1), program word line WLP[N−1] is set with a programming voltage PV1 and read word line WLR[N−1] is set with a read voltage PR1, and the program word line WLP[0] and the read word line WLR[ ] of unselected memory cells (e.g., memory cell 220b1) is set to 0 volts, and the program word line WLP and read word line WLR of unselected memory cells in memory cell arrays 220b-220d is set to 0 volts. In some embodiments, the programming voltage PV1 is different from the read voltage PR1.

Other configurations of memory circuit 200 are within the scope of the present disclosure.

Figure 3:
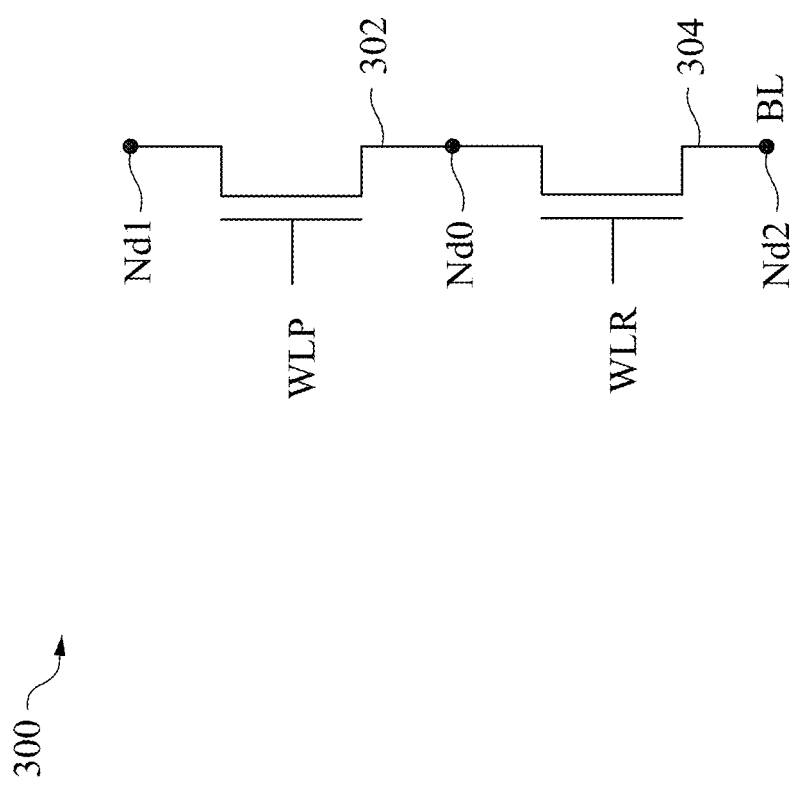
FIG. 3 is a circuit diagram of a memory cell, in accordance with some embodiments.

FIG. 3 is a circuit diagram of a memory cell 300, in accordance with some embodiments.

Memory cell 300 is an embodiment of one or more memory cells in memory cell array 110AR of FIG. 1, and similar detailed description is therefore omitted.

In some embodiments, memory cell 300 is an anti-fuse memory cell. In some embodiments, memory cell 300 is also referred to as a one-time programmable (OTP) memory cell. In some embodiments, memory cell 300 is a fuse memory cell.

Memory cell 300 includes a program transistor 302 and a read transistor 304. The read transistor 304 is coupled between the program transistor 302 and a bit line BL. The program transistor 302 is coupled between the read transistor 304 and a node Nd1. Stated differently, program transistor 302 is coupled between a node Nd1 and a node Nd0, and read transistor 304 is coupled between node Nd0 and a node Nd2. Node Nd2 is further coupled to the bit line BL.

Memory cell 300 is configured to store a logic "1" or a logic "0" based on at least a resistance of the program transistor 302. Other types of memory are within the scope of various embodiments.

In the embodiment depicted in FIG. 3, each of program transistor 302 and read transistor 304 is an n-type Metal-Oxide-Semiconductor (NMOS) transistor. In some embodiments, one or both of program transistor 302 or read transistor 304 is a p-type Metal-Oxide-Semiconductor (PMOS) transistor. Other types of transistors are within the scope of various embodiments.

A first source/drain terminal of read transistor 304 is coupled to the bit line BL by node Nd2. In some embodiments, at least node Nd2 or first source/drain terminal of read transistor 304 has a bit line signal (not labelled). A gate terminal of read transistor 304 is coupled to a read word line WLR, and is configured to receive a read word line signal. A second source/drain terminal of read transistor 304 is coupled to a first source/drain terminal of program transistor 302 by node Nd0.

A gate terminal of program transistor 302 is coupled to a program word line WLP, and is configured to receive a program word line signal. A second source/drain terminal of program transistor 302 is coupled to node Nd1. In some embodiments, node Nd1 and the second source/drain terminal of program transistor 302 are electrically floating.

The reference designation WLR in the present disclosure denotes a read word line throughout the description. The reference designation WLP in the present disclosure denotes a program word line throughout the description.

In some embodiments, the read word lines WLR are coupled to read word line driver circuits (e.g., WLP/WLR driver 110AC in FIG. 1), and the program word lines WLP are coupled to program word line driver circuits (e.g., WLP/WLR driver 110AC in FIG. 1).

In some embodiments, when read word line features are denoted as WLR0 and WLR1, read word lines WLR0 and WLR1 indicates that two different read word lines (e.g., WLR0 and WLR1) of corresponding memory cells are described. Similarly, when program word line features are denoted as WLP0 and WLP1, program word lines WLP0 and WLP1 indicates that two different program word lines (e.g., WLP0 and WLP1) of corresponding memory cells are described.

In some embodiments, the read word line WLR is also referred to as a "selection word line," "word line gate line," and the like. In some embodiments, the program word line WLP is also referred to as "program gate line," "anti-fuse gate line," "anti-fuse control line," and the like.

In some embodiments, read transistor 304 is also referred to as a "selection transistor," and program transistor 302 is also referred to as a "program transistor."

In program and read operations of memory cell 300, the program word line signal WLP is applied to the gate terminal of program transistor 302, and read transistor 304 is turned on responsive to the read word line signal WLR being applied to the gate terminal of read transistor 304 and the bit line signal of the bit line BL having a ground voltage level.

Prior to a program operation, a dielectric layer of the gate terminal of program transistor 302 is configured as an insulator having a high resistance state that represents a logically high level in some embodiments. During the program operation, signal WLP has a voltage VP that produces an electric field across the dielectric layer of the gate terminal of the program transistor 302 sufficiently large to sustainably alter the dielectric material such that a resultant lowered resistance state of the dielectric layer represents a logically low level in some embodiments. In some embodiments, a high resistance state is a state of the program transistor 302 having a first resistance that is greater than a second resistance of the low resistance state of the program transistor 302.

In some embodiments, a low resistance state corresponds to memory cell 300 storing a logic 1, and a high resistance state corresponds to memory cell 300 storing a logic 0. Other resistance states and corresponding stored logic values are within the scope of the present disclosure. For example, in some embodiments, a high resistance state corresponds to memory cell 300 storing a logic 1, and a low resistance state corresponds to memory cell 300 storing a logic 0.

In a read operation, signal WLP has a voltage level VR that produces an electric field that is sufficiently small to avoid sustainably altering the gate dielectric material of the program transistor 302 and sufficiently large to generate a current (e.g., cell current Icell in FIG. 4) flowing through the S/D terminals of read transistor 304 and having a magnitude capable of being sensed by a sense amplifier (e.g., read circuit 400, 500, 600, 700, 900, 1100, 1200 and 1300) and thereby used to determine a programmed status of memory cell 300. In some embodiments, voltage level VP is larger than voltage level VR.

The above implementations of the read transistor 304 and the program transistor 302 are for illustrative purposes. Various other implementations of read transistor 304 and program transistor 302 are within the contemplated scope of the present disclosure. For example, in some embodiments, depending on various manufacturing processes, read transistor 304 and program transistor 302 are implemented with other types of transistors.

The configuration of the anti-fuse memory cell 300 as illustrated above for programming and reading operations is also given for illustrative purposes. Various other configurations of memory cell 300 are within the contemplated scope of the present disclosure. For example, in some embodiments, other voltage values are provided to one or more of the bit line BL, the program word line WLP or the read word line WLR.

Figure 4:
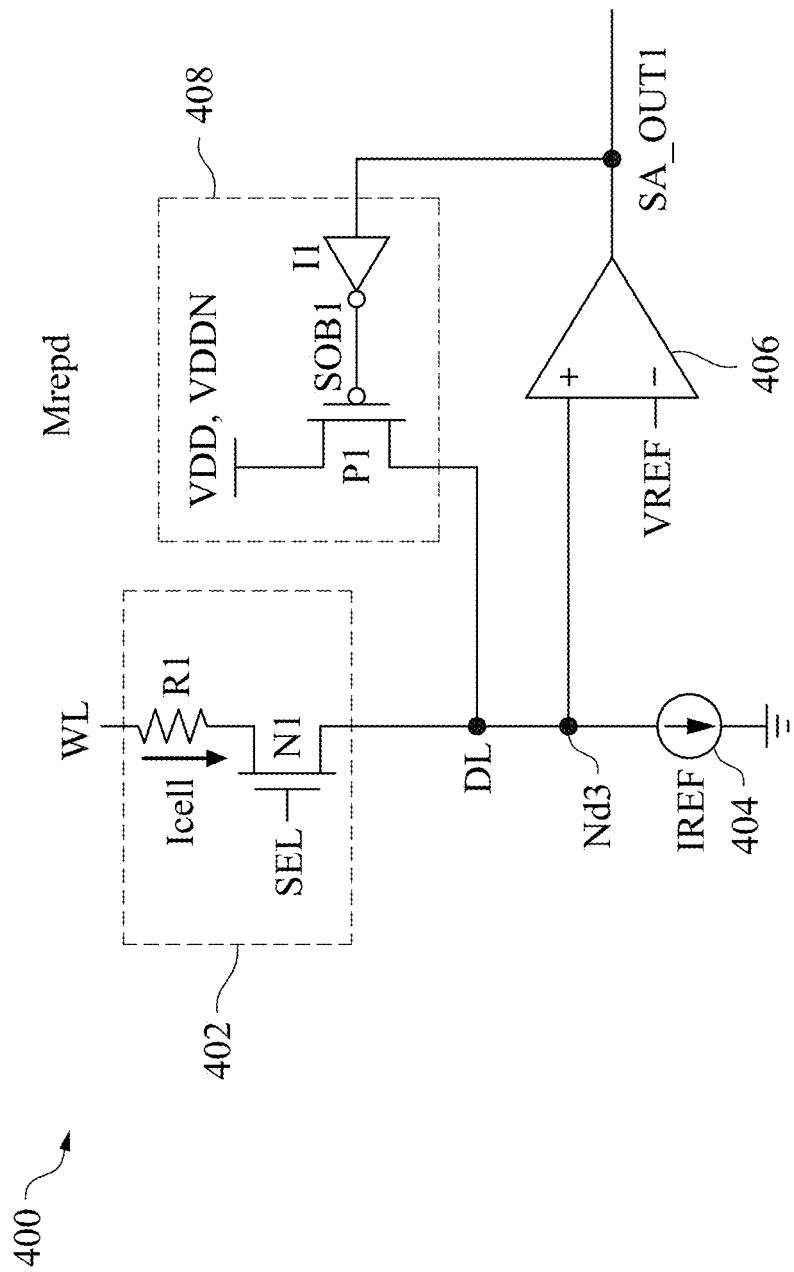
FIG. 4 is a circuit diagram of a circuit, in accordance with some embodiments.

FIG. 4 is a circuit diagram of a circuit 400, in accordance with some embodiments.

Circuit 400 is an embodiment of at least read/program circuit 102U or 102L of FIG. 1 or read circuit 204a and memory cell 220a1 of FIG. 2, and similar detailed description is therefore omitted.

In some embodiments, circuit 400 or circuit 500, 600, 700 900, 1100, 1200, 1300 of corresponding FIGS. 5, 6, 7A-7B, 9, 11, 12, 13 are a read circuit configured to read data stored in one or more memory cells (e.g., memory cell 300) in memory cell array 110AR.

Circuit 400 includes a memory cell 402, a current source 404, a comparator 406 and a detection circuit 408.

Memory cell 402 is configured to store data. In some embodiments, memory cell 402 corresponds to memory cell 300 of FIG. 3, and similar detailed description is therefore omitted. Memory cell 402 is coupled between word line WL and a node Nd3. In some embodiments, a cell current Icell flows through memory cell 402. In some embodiments, the cell current Icell is a read current that corresponds to a value of data stored in circuit 400.

Memory cell 402 includes a resistor R1 and an NMOS transistor N1. In some embodiments, resistor R1 is an equivalent resistance that corresponds to program transistor 302 of FIG. 3, NMOS transistor N1 corresponds to the read transistor 304 of FIG. 3, word line WL corresponds to the program word line WLP, and a select signal SEL corresponds to the read word line WLR, and similar detailed description is therefore omitted. In some embodiments, resistor R1 is an equivalent resistance between the gate and source of program transistor 302 of FIG. 3.

A first end of resistor R1 is coupled to the word line WL. A second end of resistor R1 is coupled to a drain terminal of NMOS transistor N1. A gate terminal of NMOS transistor N1 is configured to receive select signal SEL. A source terminal of NMOS transistor N1 is coupled to a node Nd3, a first end of current source 404, a non-inverting input terminal of comparator 406, and the detection circuit 408.

In some embodiments, select signal SEL is a select signal configured to cause memory cell 402 to be enabled (e.g., turned on) or disabled (e.g., turned off). In some embodiments, if NMOS transistor N1 is turned off in response to select signal SEL, then the second end of resistor R1 and node Nd3 are not coupled together, and cell current Icell does not flow through NMOS transistor N1. In some embodiments, if NMOS transistor N1 is turned on in response to select signal SEL, then the second end of resistor R1 and node Nd3 are coupled together, and cell current Icell flows through NMOS transistor N1 to at least node Nd3. Stated differently, in some embodiments, if NMOS transistor N1 is enabled or turned on, then the cell current Icell flows from the word line, through resistor R1 and NMOS transistor N1, to at least node Nd3. In some embodiments, NMOS transistor N1 in memory cell 402 is enabled when a read operation is performed on memory cell 402 by comparator 406. Other configurations of memory cell 402 or types of memory cells are within the scope of the present disclosure.

Current source 404 is coupled between node Nd3 and reference voltage node VSSN. A first end of current source 404 is coupled to memory cell 402, detection circuit 408 and the non-inverting input terminal of comparator 406 by node Nd3. A second end of current source is coupled to the reference voltage node VSSN. In some embodiments, the reference voltage node VSSN has a reference voltage VSS. In some embodiments, current source 404 is an electronic circuit configured to generate a reference current IREF having one or more predetermined current levels. Reference current IREF is configured to flow from current source 404 to reference voltage node VSSN. In some embodiments, at least one predetermined current level is based on a compliance level of memory cell 402, in a read/program operation, the compliance level being a maximum current level designed to avoid an undesirable condition, e.g., an overheating and/or damaging stress level, or performance of an unreliable read/programming operation. Other configurations of current source 404 or types of current sources are within the scope of the present disclosure.

Comparator 406 is coupled between node Nd3 and an output node (not labelled).

Comparator 406 is configured to generate an output signal SA_OUT1. Comparator 406 is configured to read the data stored in memory cell 402 based on the resistance state of resistor R1. For example, in some embodiments, a low resistance state corresponds to memory cell 402 storing a logic 1, and a high resistance state corresponds to memory cell 402 storing a logic 0. Other resistance states and corresponding stored logic values are within the scope of the present disclosure. For example, in some embodiments, a high resistance state corresponds to memory cell 402 storing a logic 1, and a low resistance state corresponds to memory cell 402 storing a logic 0. In some embodiments, comparator 406 is an operational amplifier comparator. In some embodiments, comparator 406 is also referred to as a sense amplifier circuit.

A non-inverting input terminal of comparator 406 is coupled to node Nd3, the first end of current source 404, memory cell 402 and detection circuit 408. The non-inverting input terminal of comparator 406 is configured to receive a voltage DL.

An inverting input terminal of comparator 406 is coupled to a supply or a source of reference voltage VREF. The inverting input terminal of comparator 406 is configured to receive the reference voltage VREF.

An output terminal of comparator 406 is coupled to an output node (not labelled) and detection circuit 408. The output terminal of comparator 406 is configured to output the output signal SA_OUT1. In some embodiments, comparator 406 is configured to compare the voltage DL of node Nd3 with the reference voltage VREF. In some embodiments, comparator 406 is configured to generate the output signal SA_OUT1 in response to the comparison of the voltage DL of node Nd3 with the reference voltage VREF. For example, in some embodiments, if the voltage DL is less than the reference voltage VREF, then output signal SA_OUT1 is a logic 0. For example, in some embodiments, if the voltage DL is greater than the reference voltage VREF, then output signal SA_OUT1 is a logic 1.

Other configurations of comparator 406 or types of comparators are within the scope of the present disclosure.

Detection circuit 408 is coupled to node Nd3, memory cell 402, the first end of current source 404, the non-inverting input terminal of comparator 406 and the output terminal of comparator 406. In some embodiments, detection circuit 408 is configured to provide a feedback path from the output terminal of comparator 406 and node Nd3.

Detection circuit 408 is configured to set the voltage DL of node Nd3. In some embodiments, when detection circuit 408 is enabled or turned on, detection circuit 408 is configured to set the voltage DL of node Nd3 to be equal to a voltage of the output signal SA_OUT1. In other words, when detection circuit 408 is enabled or turned on, detection circuit 408 is configured to latch the output signal SA_OUT1. In some embodiments, detection circuit 408 is located at an end point of memory circuit 100, and is also referred to as a read end-point detection circuit.

Detection circuit 408 includes an inverter I1 and a P-type Metal Oxide Semiconductor (PMOS) transistor P1.

An input terminal of inverter I1 is coupled to the output terminal of comparator 406. The input terminal of inverter I1 is configured to receive output signal SA_OUT1 from comparator 406.

An output terminal of inverter I1 is coupled to a gate terminal of PMOS transistor P1. The output terminal of inverter I1 is configured to output a signal SOB1 (also referred to as "inverted output signal"). In some embodiments, signal SOB1 is inverted from output signal SA_OUT1 and vice versa.

A gate terminal of PMOS transistor P1 is configured to receive signal SOB1. A source terminal of PMOS transistor P1 is coupled to a voltage supply node VDDN. Voltage supply node VDDN has the supply voltage VDD. Voltage VDD is different from reference voltage VSS. A drain terminal of PMOS transistor P1 is coupled to node Nd3, the non-inverting input terminal of comparator 406, the first end of current source 404 and memory cell 402.

In some embodiments, signal SOB1 is configured to cause PMOS transistor P1 to be enabled (e.g., turned on) or disabled (e.g., turned off). In some embodiments, if PMOS transistor P1 is turned off in response to signal SOB1, then node Nd3 is not electrically coupled to voltage supply node VDDN. In some embodiments, if PMOS transistor P1 is turned on in response to signal SOB1, then node Nd3 is electrically coupled to voltage supply node VDDN, and node Nd3 is configured to receive supply voltage VDD.

By way of an illustrative example, if memory cell 402 is configured to store a logic 0, then resistor R1 has a high resistance state. During a read operation of memory cell 402, the select signal SEL of memory cell 402 is a logic 1 thereby causing NMOS transistor N1 to turn on, and electrically coupling resistor R1 to at least node Nd3 by NMOS transistor N1. The voltage of the word line WL is applied to memory cell 402 sufficient to cause cell current Icell to flow through resistor R1 and to at least node ND3 since NMOS transistor N1 is turned on. The voltage of the word line is applied by word line driver 110AC (FIG. 1).

However, since the resistance of R1 is high, then the cell current Icell is less than the reference current IREF, and the voltage DL of node Nd3 is less than the reference voltage VREF, and the comparator is configured to generate an output signal SA_OUT1 having a logic 0. Thus, in this non-limiting example, comparator 406 is configured to sense the data associated with the resistor R1 being in a high resistance state (e.g., "0"), and the sense amplifier (e.g., comparator 406) outputs the data stored (e.g., "0") in memory cell 402 as output signal SA_OUT1.

In response to signal SA_OUT1 being a logic 0, inverter I1 generates an inverted output signal (e.g., signal SOB1) having a logic 1. In response to signal SOB1 being a logic 1, PMOS transistor P1 is turned off, and node Nd3 is not electrically coupled to the voltage supply node VDDN.

In some embodiments, during the read operation, the NMOS transistors (e.g., similar to NMOS transistor N1) of unselected memory cells (e.g., unselected memory cell 220b in FIG. 2) are turned off by the select signal SEL being a logic 0.

By way of an illustrative example, if memory cell 402 is configured to store a logic 1, then resistor R1 has a low resistance state. During a read operation of memory cell 402, the select signal SEL of memory cell 402 is a logic 1 and the voltage of the word line WL is applied to memory cell 402 similar to the read "0" operations discussed above, and are omitted for brevity.

Cell current Icell flows through resistor R1 and to at least node ND3. However, since the resistance of R1 is low, then the cell current Icell is greater than the reference current IREF, and the voltage DL of node Nd3 is greater than the reference voltage VREF, and the comparator is configured to generate an output signal SA_OUT1 having a logic 1. Thus, in this non-limiting example, comparator 406 is configured to sense the data associated with the resistor R1 being in a low resistance state (e.g., "1"), and the sense amplifier (e.g., comparator 406) outputs the data stored (e.g., "1") in memory cell 402 as output signal SA_OUT1.

In response to signal SA_OUT1 being a logic 1, inverter I1 generates an inverted output signal (e.g., signal SOB1) having a logic 0. In response to signal SOB1 being a logic 0, PMOS transistor P1 is turned on, and node Nd3 is electrically coupled to the voltage supply node VDDN.

In response to node Nd3 being electrically coupled to the voltage supply node VDDN, the voltage DL of node Nd3 is equal to the supply voltage VDD. In some embodiments, the supply voltage VDD is equal to the voltage of the select signal SEL, thereby causing the gate to source voltage $V_{GS}$ of NMOS transistor N1 to be 0 volts. In response to the gate to source voltage $V_{GS}$ of NMOS transistor N1 being 0 volts, NMOS transistor N1 is turned off decoupling the resistor R1 from node Nd3 thereby causing the cell current Icell to be 0. In response to the cell current Icell being equal to 0, circuit 400 is still able to correctly read the data stored (logic 1) in memory cell 402, while also saving power and reducing IR drops on the word line WL.

Other configurations of detection circuit 408 or types of circuits within detection circuit 408 are within the scope of the present disclosure.

Other configurations of transistors, number of transistors or transistor types of circuit 400 are within the scope of the present disclosure.

Figure 5:
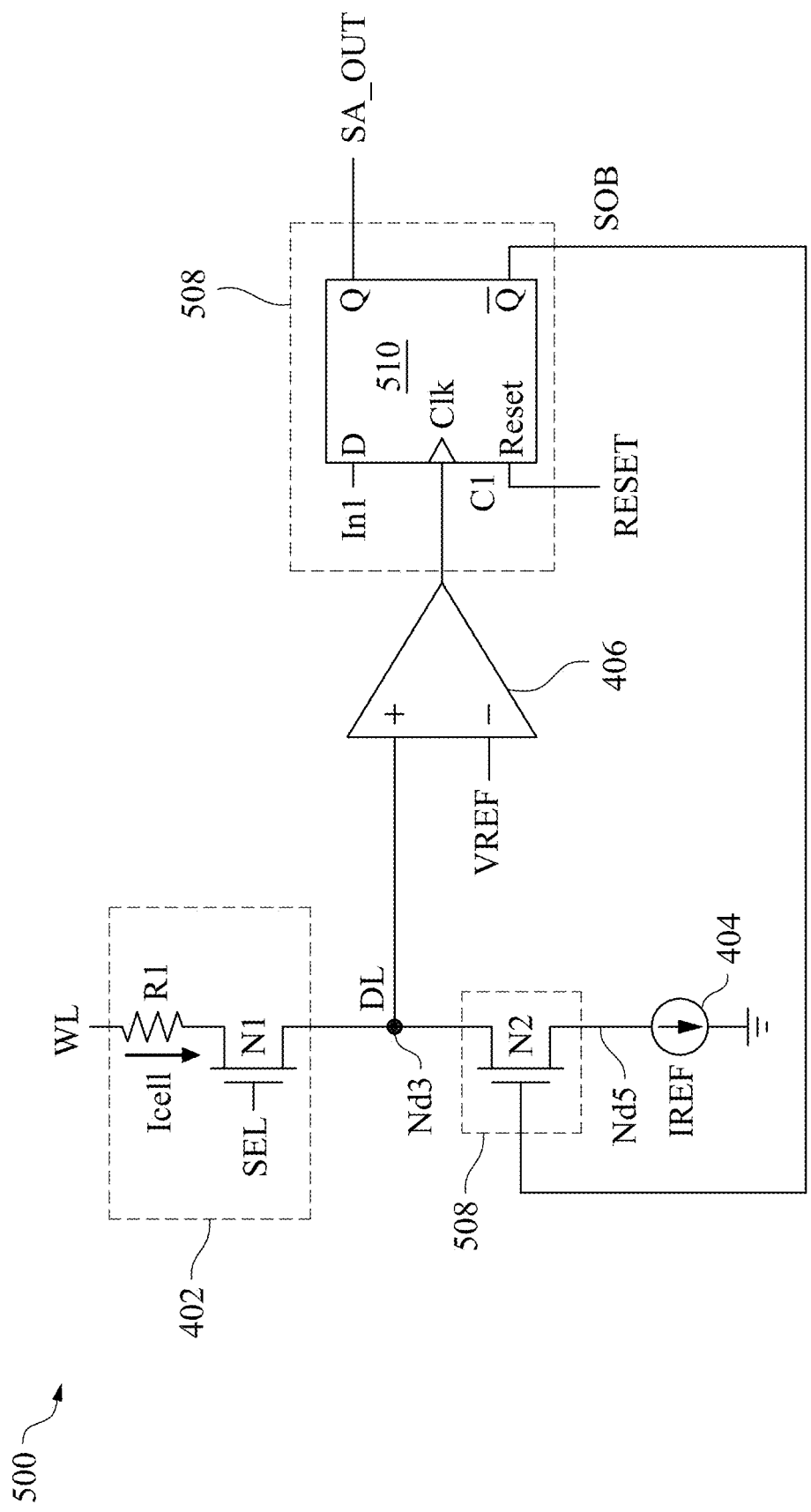
FIG. 5 is a circuit diagram of a circuit, in accordance with some embodiments.

FIG. 5 is a circuit diagram of a circuit 500, in accordance with some embodiments.

Circuit 500 is an embodiment of at least read/program circuit 102U or 102L of FIG. 1 or read circuit 204a and memory cell 220a1 of FIG. 2, and similar detailed description is therefore omitted.

Circuit 500 includes a memory cell 402, a current source 404, a comparator 406 and a detection circuit 508.

Circuit 500 is a variation of circuit 400 of FIG. 4, and similar detailed description is therefore omitted. In comparison with circuit 400 of FIG. 4, detection circuit 508 of FIG. 5 replaces detection circuit 408, and similar detailed description is therefore omitted.

Detection circuit 508 is coupled to node Nd3, memory cell 402, the first end of current source 404, the non-inverting input terminal of comparator 406 and the output terminal of comparator 406.

In some embodiments, detection circuit 508 is configured to provide a feedback path from the output terminal of comparator 406 and at least node Nd3. In some embodiments, detection circuit 508 is configured to latch the data stored in memory cell 402 as output signal SA_OUT. In some embodiments, detection circuit 508 is configured to latch the output signal SA_OUT in response to a signal C1 from comparator 406. In some embodiments, detection circuit 508 and 608 (FIG. 6) are also referred to as read end-point detection circuits.

Detection circuit 508 includes an NMOS transistor N2 and a flip-flop 510.

A gate terminal of NMOS transistor N2 is coupled to an output terminal of flip-flop 510. The gate terminal of NMOS transistor N2 is configured to receive signal SOB. In some embodiments, signal SOB corresponds to signal SOB1 of FIG. 4. A source terminal of NMOS transistor N2 is coupled to the first end of current source 404. A drain terminal of NMOS transistor N2 is coupled to node Nd3, the non-inverting input terminal of comparator 406 and memory cell 402.

In some embodiments, signal SOB is configured to cause NMOS transistor N2 to be enabled (e.g., turned on) or disabled (e.g., turned off). In some embodiments, if NMOS transistor N2 is turned off in response to signal SOB, then node Nd3 is not electrically coupled to the first end of current source 404 and the cell current Icell is 0. In some embodiments, if NMOS transistor N2 is turned on in response to signal SOB, then node Nd3 is electrically coupled to the first end of current source 404.

Flip-flop 510 is coupled between the output terminal of comparator 406 and the gate terminal of NMOS transistor N2. In some embodiments, flip-flop 510 is triggered and is configured to latch the output signal SA_OUT in response to signal C1 from comparator 406. Signal C1 corresponds to output signal SA_OUT1 of FIG. 4.

Flip-flop 510 is configured to receive signal C1, a reset signal RESET and a data signal IN1. Flip-flop 510 is configured to generate output signal SA_OUT and output signal SOB in response to at least signal C1, reset signal RESET or data signal IN1.

Flip-flop 510 is a DQ flip-flop. In some embodiments, flip-flop 510 includes an SR-flip-flop, a T flip-flop, a JK flip-flop, or the like. Other types of flip-flops or configurations for at least flip-flop 510 are within the scope of the present disclosure.

Flip-flop 510 has a clock input terminal CLK, a data input terminal D, a reset terminal Reset, a first output terminal Q and a second output terminal QB.

The clock input terminal CLK is coupled to the output terminal of the comparator 406. The clock input terminal CLK is configured to receive signal C1 from the comparator 406. In some embodiments, flip-flop 510 is a positive edge triggered flip-flop, and a transition of signal C1 from logic 0 to logic 1 will cause the flip-flop 510 to latch the data signal IN1 received on the data input terminal D. In some embodiments, flip-flop 510 is a negative edge triggered flip-flop.

The data input terminal D is configured to receive a data signal IN1. The data signal IN1 is a logic 1. In some embodiments, the data signal IN1 is a logic 0. The data input terminal D is coupled to a source (not shown) of the data signal IN1. In some embodiments, the data input terminal D is coupled to the voltage supply node VDDN.

The first output terminal Q is configured to output the output signal SA_OUT.

The second output terminal QB is coupled to the gate terminal of NMOS transistor N2. The second output terminal QB is configured to output signal SOB (also referred to as "inverted output signal"). In some embodiments, signal SOB is inverted from output signal SA_OUT and vice versa.

The reset terminal Reset is configured to receive a reset signal RESET. The reset terminal Reset is coupled to a source (not shown) of the reset signal RESET. In some embodiments, the reset signal RESET is configured to reset flip-flop 510. In some embodiments, flip-flop 510 is reset in response to the reset signal RESET being a logic 1. In some embodiments, in response to flip-flop 510 being reset, flip-flop 510 ignores the data signal IN1 received on the data input terminal D, and the output signal SA_OUT of flip-flop 510 is a logic 0. In some embodiments, flip-flop 510 is reset in response to the reset signal RESET being a logic 0.

By way of an illustrative example, if memory cell 402 is configured to store a logic 0, then resistor R1 has a high resistance state. Prior to a read operation, flip-flop 510 is reset by reset signal RESET thereby causing the output signal SA_OUT of flip-flop 510 to be a logic 0, and output signal SOB of flip-flop 510 to be a logic 1. In response to output signal SOB being a logic 1, NMOS transistor N2 is turned on thereby coupling node ND3 and the first end of current source 404.

During a read operation of memory cell 402 of FIG. 5, the select signal SEL of memory cell 402 is a logic 1 and the voltage of the word line WL is applied to memory cell 402 thereby electrically coupling the resistor R1 to node Nd3, and is similar to the read operations discussed above in FIG. 4, and are omitted for brevity.

Cell current Icell flows through resistor R1 and to at least node ND3. However, since the resistance of R1 is high, then the cell current Icell is less than the reference current IREF, and the voltage DL of node Nd3 is less than the reference voltage VREF, and the comparator 406 is configured to generate signal C1 having a logic 0. In response to signal C1 having a logic 0, the flip-flop 510 is not triggered, and the output signal SA_OUT of flip-flop 510 is a logic 0, and output signal SOB is a logic 1. In response to the output signal SOB being a logic 1, NMOS transistor N2 is turned on thereby coupling node ND3 and the first end of current source 404. Thus, in this non-limiting example, comparator 406 and flip-flop 510 are configured to sense the data associated with the resistor R1 being in a high resistance state (e.g., "0"), and the comparator 406 and flip-flop 510 output the data stored (e.g., "0") in memory cell 402 as output signal SA_OUT.

By way of an illustrative example, if memory cell 402 is configured to store a logic 1, then resistor R1 has a low resistance state. Prior to a read operation, flip-flop 510 is reset by reset signal RESET thereby causing the output signal SA_OUT of flip-flop 510 to be a logic 0, and output signal SOB of flip-flop 510 to be a logic 1. In response to output signal SOB being a logic 1, NMOS transistor N2 is turned on thereby coupling node ND3 and the first end of current source 404.

During a read operation of memory cell 402 of FIG. 5, the select signal SEL of memory cell 402 is a logic 1 and the voltage of the word line WL is applied to memory cell 402 thereby electrically coupling the resistor R1 to node Nd3, and is similar to the read operations discussed above in FIG. 4, and are omitted for brevity.

Cell current Icell flows through resistor R1 and to at least node ND3. However, since the resistance of R1 is low, then the cell current Icell is greater than the reference current IREF, and the voltage DL of node Nd3 is greater than the reference voltage VREF, and the comparator 406 is configured to cause signal C1 to transition from a logic 0 to a logic 1. In response to signal C1 transitioning from a logic 0 to a logic 1, the flip-flop 510 is triggered, and the flip-flop 510 is configured to latch the data signal IN1 received on the data input terminal D. In this embodiment, the data signal IN1 is a logic 1, so the output signal SA_OUT of flip-flop 510 is a logic 1, and output signal SOB is a logic 0. In response to the output signal SOB being a logic 0, NMOS transistor N2 is turned off thereby decoupling node ND3 and the first end of current source 404 from each other. In response to node ND3 and the first end of current source 404 being decoupled from each other, causes the cell current Icell to be 0. In response to the cell current Icell being equal to 0, circuit 500 is still able to correctly read the data stored (logic 1) in memory cell 402, while also saving power and reducing IR drops on the word line WL. Thus, in this non-limiting example, comparator 406 and flip-flop 510 are configured to sense the data associated with the resistor R1 being in a low resistance state (e.g., "1"), and the comparator 406 and flip-flop 510 output the data stored (e.g., "1") in memory cell 402 as output signal SA_OUT.

Other configurations of detection circuit 508 or types of circuits within detection circuit 508 are within the scope of the present disclosure.

Other configurations of transistors, number of transistors or transistor types of circuit 500 are within the scope of the present disclosure.

Figure 6:
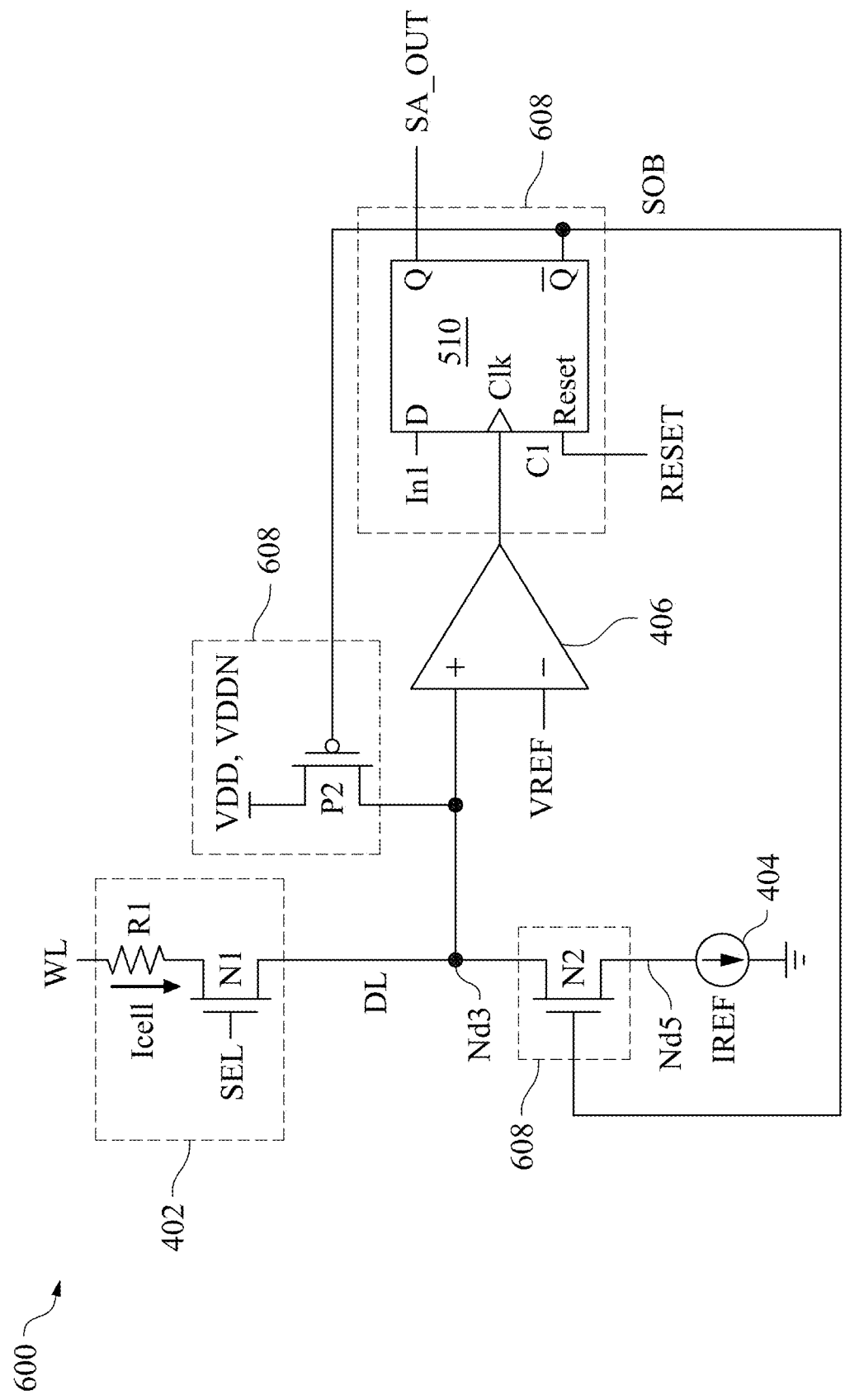
FIG. 6 is a circuit diagram of a circuit, in accordance with some embodiments.

FIG. 6 is a circuit diagram of a circuit 600, in accordance with some embodiments.

Circuit 600 is an embodiment of at least read/program circuit 102U or 102L of FIG. 1 or read circuit 204a and memory cell 220a1 of FIG. 2, and similar detailed description is therefore omitted.

Circuit 600 includes a memory cell 402, a current source 404, a comparator 406 and a detection circuit 608.

Circuit 600 is a variation of circuit 400 of FIG. 4 and circuit 500 of FIG. 5, and similar detailed description is therefore omitted. In comparison with circuit 500 of FIG. 5, detection circuit 608 of FIG. 6 replaces detection circuit 508, and similar detailed description is therefore omitted.

Detection circuit 608 is a variation of detection circuit 408 of FIG. 4 and detection circuit 508 of FIG. 5, and similar detailed description is therefore omitted. For example, in some embodiments, detection circuit 608 is a hybrid of detection circuit 408 and detection circuit 508.

In comparison with detection circuit 508 of FIG. 5, detection circuit 608 of FIG. 6 further includes a PMOS transistor P2, and similar detailed description is therefore omitted. In some embodiments, PMOS transistor P2 is similar to PMOS transistor P1 of FIG. 4, and similar detailed description is therefore omitted.

Detection circuit 608 includes NMOS transistor N2, flip-flop 510 and PMOS transistor P2.

Flip-flop 510 is coupled between the output terminal of comparator 406, the gate terminal of NMOS transistor N2 and a gate terminal of PMOS transistor P2. The second output terminal QB is coupled to the gate terminal of NMOS transistor N2 and the gate terminal of PMOS transistor P2.

A gate terminal of PMOS transistor P2 is coupled to the second output terminal QB. A gate terminal of PMOS transistor P2 is configured to receive signal SOB. A source terminal of PMOS transistor P2 is coupled to a voltage supply node VDDN. Voltage supply node VDDN has the supply voltage VDD. A drain terminal of PMOS transistor P2 is coupled to node Nd3, the non-inverting input terminal of comparator 406, the first end of current source 404 and memory cell 402. The operation of PMOS transistor P2 is similar to the operation of PMOS transistor P1, and similar detailed description is therefore omitted.

By way of an illustrative example, if memory cell 402 is configured to store a logic 0, then resistor R1 has a high resistance state. Prior to a read operation, flip-flop 510 is reset by reset signal RESET thereby causing the output signal SA_OUT of flip-flop 510 to be a logic 0, and output signal SOB of flip-flop 510 to be a logic 1. In response to output signal SOB being a logic 1, NMOS transistor N2 is turned on thereby coupling node ND3 and the first end of current source 404, and PMOS transistor P2 is turned off thereby decoupling node ND3 and the supply voltage node VDDN.

During a read operation of memory cell 402 of FIG. 5, the select signal SEL of memory cell 402 is a logic 1 and the voltage of the word line WL is applied to memory cell 402 thereby electrically coupling the resistor R1 to node Nd3, and is similar to the read operations discussed above in FIG. 4, and are omitted for brevity.

Cell current Icell flows through resistor R1 and to at least node ND3. However, since the resistance of R1 is high, then the cell current Icell is less than the reference current IREF, and the voltage DL of node Nd3 is less than the reference voltage VREF, and the comparator 406 is configured to generate signal C1 having a logic 0. In response to signal C1 having a logic 0, the flip-flop 510 is not triggered, and the output signal SA_OUT of flip-flop 510 is a logic 0, and output signal SOB is a logic 1. In response to the output signal SOB being a logic 1, NMOS transistor N2 is turned on thereby coupling node ND3 and the first end of current source 404, and PMOS transistor P2 is turned off thereby decoupling node ND3 and the supply voltage node VDDN. Thus, in this non-limiting example, comparator 406 and flip-flop 510 of FIG. 6 are configured to sense the data associated with the resistor R1 being in a high resistance state (e.g., "0"), and the comparator 406 and flip-flop 510 of FIG. 6 output the data stored (e.g., "0") in memory cell 402 as output signal SA_OUT.

By way of an illustrative example, if memory cell 402 is configured to store a logic 1, then resistor R1 has a low resistance state. Prior to a read operation, flip-flop 510 is reset by reset signal RESET thereby causing the output signal SA_OUT of flip-flop 510 to be a logic 0, and output signal SOB of flip-flop 510 to be a logic 1. In response to output signal SOB being a logic 1, NMOS transistor N2 is turned on thereby coupling node ND3 and the first end of current source 404, PMOS transistor P2 is turned off thereby decoupling node ND3 and the supply voltage node VDDN.

During a read operation of memory cell 402 of FIG. 5, the select signal SEL of memory cell 402 is a logic 1 and the voltage of the word line WL is applied to memory cell 402 similar to the read operations discussed above in FIG. 4, and are omitted for brevity.

Cell current Icell flows through resistor R1 and to at least node ND3. However, since the resistance of R1 is low, then the cell current Icell is greater than the reference current IREF, and the voltage DL of node Nd3 is greater than the reference voltage VREF, and the comparator 406 is configured to cause signal C1 to transition from a logic 0 to a logic 1. In response to signal C1 transitioning from a logic 0 to a logic 1, the flip-flop 510 is triggered, and the flip-flop 510 is configured to latch the data signal IN1 received on the data input terminal D. In this embodiment, the data signal IN1 is a logic 1, so the output signal SA_OUT of flip-flop 510 is a logic 1, and output signal SOB is a logic 0. In response to the output signal SOB being a logic 0, NMOS transistor N2 is turned off thereby decoupling node ND3 and the first end of current source 404 from each other, and PMOS transistor P2 is turned on thereby coupling node ND3 and the supply voltage node VDDN together.

In response to node ND3 and the first end of current source 404 being decoupled from each other disrupts the current path and causes the cell current Icell to be 0.

In response to node Nd3 being electrically coupled to the voltage supply node VDDN, the voltage DL of node Nd3 is equal to the supply voltage VDD and the voltage of the select signal SEL, thereby causing the gate to source voltage $V_{GS}$ of NMOS transistor N1 to be 0 volts. In response to the gate to source voltage $V_{GS}$ of NMOS transistor N1 being 0 volts, NMOS transistor N1 is turned off decoupling the resistor R1 from node Nd3 thereby causing the cell current Icell to be 0.

Thus, in response to node ND3 and the first end of current source 404 being decoupled from each other, and NMOS transistor N1 being turned off causes the cell current Icell to be 0.

In response to the cell current Icell being equal to 0, circuit 600 is still able to correctly read the data stored (logic 1) in memory cell 402, while also saving power and reducing IR drops on the word line WL. Thus, in this non-limiting example, comparator 406 and flip-flop 510 of FIG. 6 are configured to sense the data associated with the resistor R1 being in a low resistance state (e.g., "1"), and the comparator 406 and flip-flop 510 of FIG. 6 output the data stored (e.g., "1") in memory cell 402 as output signal SA_OUT.

Other configurations of detection circuit 608 or types of circuits within detection circuit 608 are within the scope of the present disclosure.

Other configurations of transistors, number of transistors or transistor types of circuit 600 are within the scope of the present disclosure.

Figure 7A:
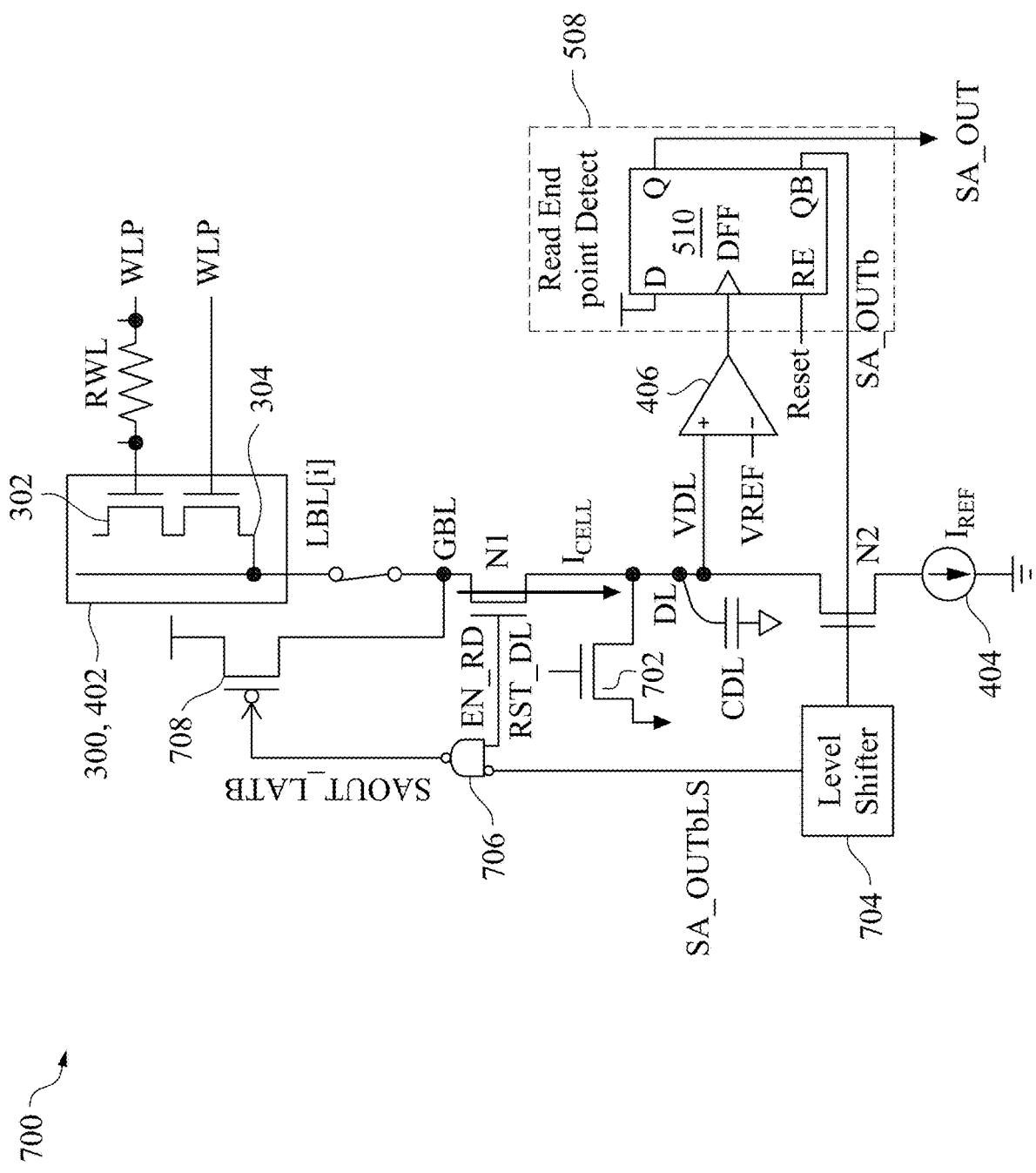
FIG. 7A is a circuit diagram of a circuit, in accordance with some embodiments.

FIG. 7A is a circuit diagram of a circuit 700, in accordance with some embodiments.

Figure 7B:
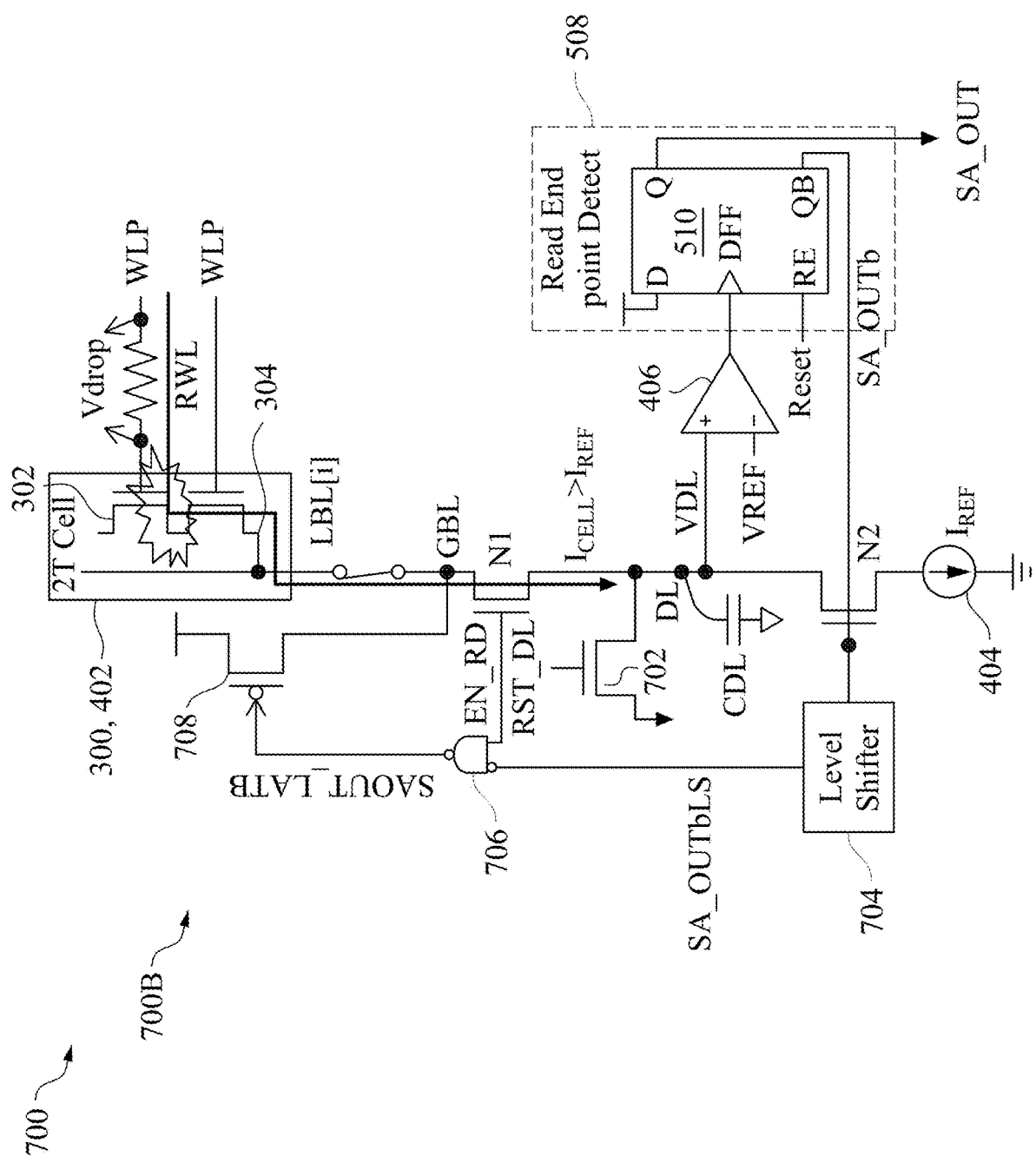
FIG. 7B is a circuit diagram of a portion of circuit of FIG. 7A, in accordance with some embodiments.

FIG. 7B is a circuit diagram of a portion 700B of circuit 700 of FIG. 7A, in accordance with some embodiments.

Figure 7C:
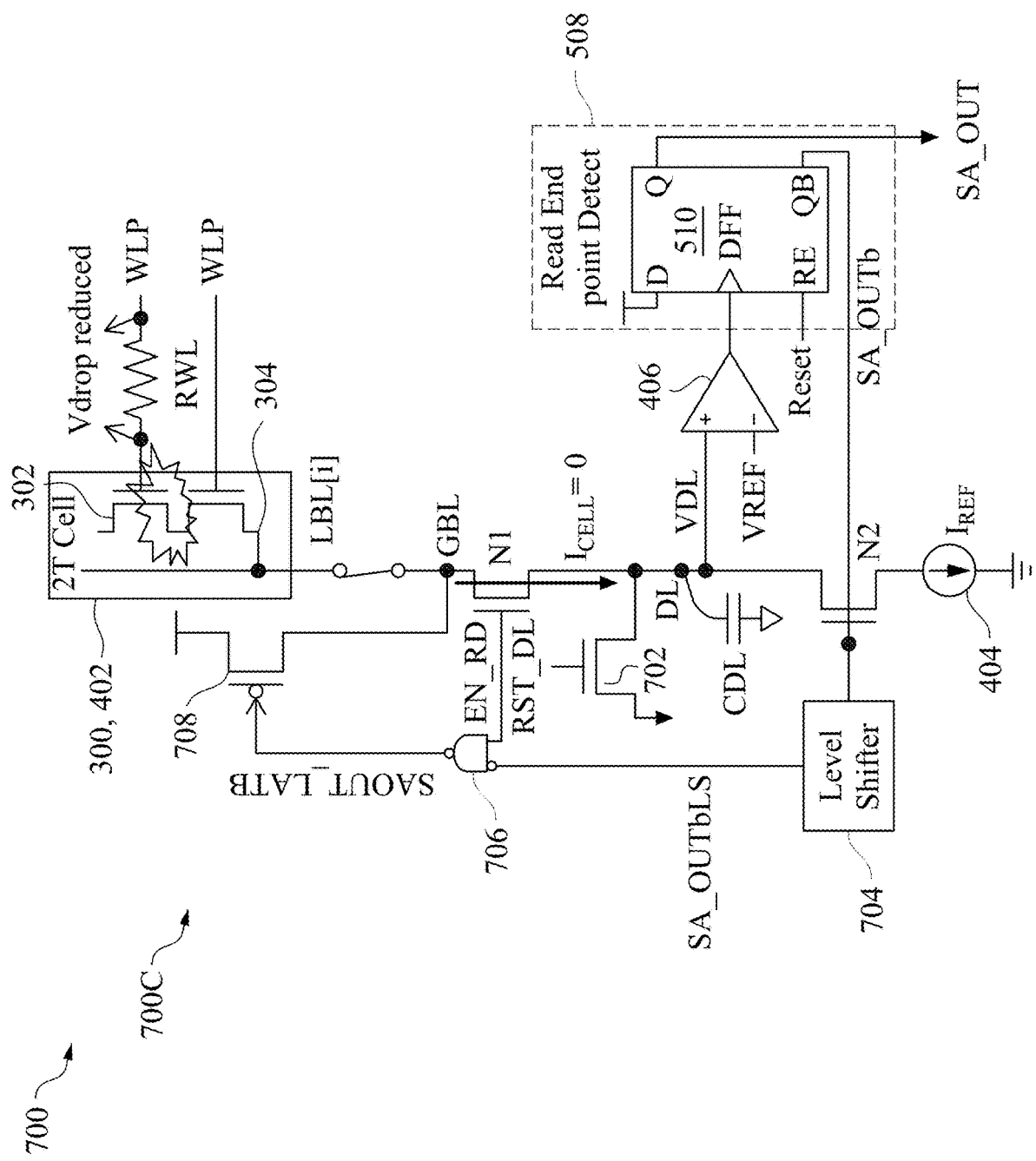
FIG. 7C is a circuit diagram of a portion of circuit of FIG. 7A, in accordance with some embodiments.

FIG. 7C is a circuit diagram of a portion 700C of circuit 700 of FIG. 7A, in accordance with some embodiments.

Portion 700B is circuit 700 prior to the latching of the output signal SA_OUT during a read "1" operation, and portion 700B is shown with lighter shading than other portions of circuit 700, for ease of illustration. For example, portion 700B includes an NMOS transistor 702, a level shifter 704, a NAND logic gate 706, a detection circuit 508 and a PMOS transistor 708.

Portion 700C is circuit 700 after latching of the output signal SA_OUT during a read "1" operation, and portion 700C is shown with lighter shading than other portions of circuit 700, for ease of illustration. For example, portion 700C includes NMOS transistor 702 and current source 404.

Circuit 700 is an embodiment of at least read/program circuit 102U or 102L of FIG. 1 and BL selection circuit 110BS of FIG. 1, and similar detailed description is therefore omitted.

Circuit 700 is an embodiment of circuit 200 of FIG. 2, and similar detailed description is therefore omitted. For example, circuit 700 is an embodiment of memory cell 220a1, read circuit 204a and multiplexer 212a of FIG. 2, and similar detailed description is therefore omitted.

Circuit 700 is a variation of circuit 500 of FIG. 5, and similar detailed description is therefore omitted. In comparison with circuit 500 of FIG. 5, circuit 700 further includes an NMOS transistor 702, a level shifter 704, a NAND logic gate 706 and a PMOS transistor 708, and similar detailed description is therefore omitted. In comparison with circuit 500 of FIG. 5, memory cell 300 replaces memory cell 402, and similar detailed description is therefore omitted.

NMOS transistor 702 is a reset switch configured to reset a voltage of the global bit line GBL in response to a reset data line signal RST_DL.

A gate terminal of NMOS transistor 702 is configured to receive a reset data line signal RST_DL. The gate terminal of NMOS transistor 702 is coupled to a source of the reset data line signal RST_DL. In some embodiments, the reset data line signal RST_DL corresponds to the pulse PDC signal of FIGS. 14-15. A source terminal of NMOS transistor 702 is coupled to the reference voltage supply node VSSN. Reference voltage supply node VSSN has the reference supply voltage VSS. A drain terminal of NMOS transistor 702 is coupled to node Nd3, the non-inverting input terminal of comparator 406, the drain terminal of NMOS transistor N2 and the source terminal of NMOS transistor N1.

NMOS transistor 702 is a reset switch configured to reset a voltage of the global bit line GBL in response to reset data line signal RST_DL. Circuit 700 is shown with an equivalent capacitance CDL of the global bit line BL. In some embodiments, the voltage on the global bit line GBL is stored in the capacitance CDL of the global bit line BL.

In some embodiments, the reset data line signal RST_DL is configured to cause NMOS transistor 702 to be enabled (e.g., turned on) or disabled (e.g., turned off). In some embodiments, if NMOS transistor 702 is turned on in response to reset data line signal RST_DL, then NMOS transistor 702 is configured to discharge the global bit line GBL to reference voltage VSS. In some embodiments, if NMOS transistor 702 is turned off in response to reset data line signal RST_DL, then NMOS transistor 702 does not discharge the global bit line GBL.

Level shifter 704 is coupled to the second output terminal of flip-flop 510, the gate terminal of NMOS transistor N2 and an inverting input terminal of NAND logic gate 706.

An input terminal of level shifter 704 is coupled to the second output terminal of flip-flop 510 and the gate terminal of NMOS transistor N2. An output terminal of level shifter 704 is coupled to the inverting input terminal of NAND logic gate 706.

Level shifter circuit 704 is configured to receive at least output signal SA_OUTb. Output signal SA_OUTb corresponds to signal SOB of FIGS. 5-6. Level shifter circuit 704 is a level shifter circuit configured to shift output signal SA_OUTb from the VDD voltage domain to a VDDM voltage domain thereby generating output signal SA_OUTbLS. In some embodiments, level shifter 704 is not included in circuit 700 if circuit operates on a single voltage domain. In some embodiments, the VDD voltage domain is different from the VDDM voltage domain.

In some embodiments, output signal SA_OUTb has a first voltage swing between voltage VDD and reference voltage VSS. In some embodiments, output signal SA_OUTbLS has a second voltage swing between voltage VDDM and reference voltage VSS.

NAND logic gate 706 is coupled to level shifter 704, NMOS transistor N1 and PMOS transistor 708.

NAND logic gate 706 is configured to generate signal SAOUT_LATB in response to an enable signal EN_RD and an inverted version (e.g., a level shifted version of output signal SA_OUT) of output signal SA_OUTbLS.

An inverting input terminal of NAND logic gate 706 is coupled to the output terminal of level shifter 704, and a non-inverting input terminal of NAND logic gate 706 is coupled to the gate terminal of NMOS transistor N1 and a source of the enable signal EN_RD.

The inverting input terminal of NAND logic gate 706 is configured to receive output signal SA_OUTbLS, and to generate the inverted version (e.g., a level shifted version of output signal SA_OUT) of output signal SA_OUTbLS for NAND logic gate 706. In some embodiments, the inverting input terminal of NAND logic gate 706 corresponds to an inverter (not shown). The non-inverting input terminal of NAND logic gate 706 is configured to receive an enable signal EN_RD. In some embodiments, enable signal EN_RD corresponds to select signal SEL of FIGS. 4-6.

An output terminal of NAND logic gate 706 is configured to output signal SAOUT_LATB.

PMOS transistor 708 is configured to receive the output signal SAOUT_LATB. In some embodiments, PMOS transistor 708 is configured to set the voltage of the global bit line GBL to the voltage VDD in response to output signal SAOUT_LATB.

In some embodiments, PMOS transistor 708 is an embodiment of multiplexer 212a of FIG. 2, and similar detailed description is therefore omitted.

A gate terminal of PMOS transistor 708 is coupled to the output terminal of NAND logic gate 706. A gate terminal of PMOS transistor 708 is configured to receive output signal SAOUT_LATB. A source terminal of PMOS transistor 708 is coupled to a voltage supply node VDDN. Voltage supply node VDDN has the supply voltage VDD. A drain terminal of PMOS transistor 708 is coupled to at least the global bit line GBL, the drain terminal of NMOS transistor N1 or memory cell 300 or 402.

In some embodiments, the output signal SAOUT_LATB is configured to cause PMOS transistor 708 to be enabled (e.g., turned on) or disabled (e.g., turned off). In some embodiments, if PMOS transistor 708 is turned on in response to output signal SAOUT_LATB, then PMOS transistor 708 is configured to pull the global bit line GBL to supply voltage VDD. In some embodiments, if PMOS transistor 708 is turned off in response to output signal SAOUT_LATB, then PMOS transistor 708 does not pull the global bit line GBL to supply voltage VDD.

Further details of the operation of circuit 700 are described below in FIG. 8.

Other configurations of transistors, number of transistors or transistor types of circuit 700 are within the scope of the present disclosure.

FIG. 8 is a timing diagram 800 of waveforms of a circuit, such as circuit 700 in FIGS. 7A-7C, in accordance with some embodiments.

In some embodiments, FIG. 8 is a timing diagram 800 of waveforms of at least circuit 400-600 in FIGS. 4-6, in accordance with some embodiments.

Prior to time T1, cell current Icell is 0, and the output signal SA_OUT is logic 0.

At time T1, signal EN_RD transitions from logic 0 to logic 1, thereby causing NMOS transistor N1 to turn on. In response to NMOS transistor N1 turning on, node Nd3 is electrically coupled to memory cell 300 or 402 and the cell current Icell transitions to a value greater than the reference current $I_{REF}$ since memory cell 300 or 402 has a low resistance state (e.g., stores a logic 1) as described above in FIGS. 4-5.

At time T1, reset data line signal RST_DL transitions from logic 0 to logic 1, thereby causing NMOS transistor 702 to turn on. In response to NMOS transistor 702 turning on, the global bit line GBL is discharged to reference voltage VSS, and since NMOS transistor N1 is turned on, the voltage VDL of node Nd3 is also discharged to reference voltage VSS. In some embodiments, the time between T1 and T2 is also referred to as a resetting of the voltage VDL of node Nd3.

At time T2, reset data line signal RST_DL transitions from logic 1 to logic 0, thereby causing NMOS transistor 702 to turn off. In response to NMOS transistor 702 turning off, the global bit line GBL and the voltage VDL of node Nd3 are no longer discharged to reference voltage VSS.

At time T2, since NMOS transistor 702 is turning off, the voltage VDL of node Nd3 starts to rise toward a voltage VDD of logic 1. At time T2, the cell current Icell is greater than the reference current IREF.

At time T3, NMOS transistor 702 is turned off, and the voltage VDL of node Nd3 transitions to being greater than the reference voltage VREF received by comparator 406. In response to the voltage VDL of node Nd3 being greater than the reference voltage VREF, causes the signal C1 output by comparator 406 to transition from a logic 0 to a logic 1.

At time T4, in response to signal C1 transitioning from a logic 0 to a logic 1, the flip-flop 510 is triggered, and the flip-flop 510 is configured to latch the data signal IN1 (e.g., logic 1) received on the data input terminal D, and output signal SA_OUT of flip-flop 510 transitions to a logic 1, and output signal SA_OUTb transitions to a logic 0.

At time T4, in response to output signal SA_OUTb transitioning to a logic 0, causes NMOS transistor N2 to turn off thereby decoupling node ND3 and the first end of current source 404 from each other, thereby causing the reference current $I_{REF}$ and the cell current Icell to transition to 0.

At time T5, in response to output signal SA_OUTb transitioning to a logic 0, causes output signal SAOUT_LATB to transition to logic 0. In response to output signal SAOUT_LATb transitioning to logic 0, causes PMOS transistor 708 to turn on. In response to PMOS transistor 708 turning on, the global bit line GBL is pulled towards supply voltage VDD and the voltage VDL of node Nd3 is further pulled towards supply voltage VDD. In response to the global bit line GBL being at supply voltage VDD causes the voltage of the drain of NMOS transistor N1 to be VDD, and thereby causing the gate to drain voltage $V_{GD}$ of NMOS transistor N1 to be 0 volts. In response to the voltage VDL of node Nd3 being at supply voltage VDD causes the voltage of the source of NMOS transistor N1 to be VDD, and thereby causing the gate to source voltage $V_{GS}$ of NMOS transistor N1 to be 0 volts.

In response to the gate to source voltage $V_{GS}$ of NMOS transistor N1 and the gate to drain voltage $V_{GD}$ of NMOS transistor N1 being 0 volts, NMOS transistor N1 is turned off decoupling memory cell 300 or 402 from node Nd3 thereby reinforcing that the cell current Icell is 0.

In response to the cell current Icell being equal to 0, circuit 700 is still able to correctly read the data stored (logic 1) in memory cell 300 or 402, while also saving power and reducing IR drops on the word line WL.

Other timing diagrams of waveforms of circuit 400-700 are within the scope of the present disclosure.

Figure 9:
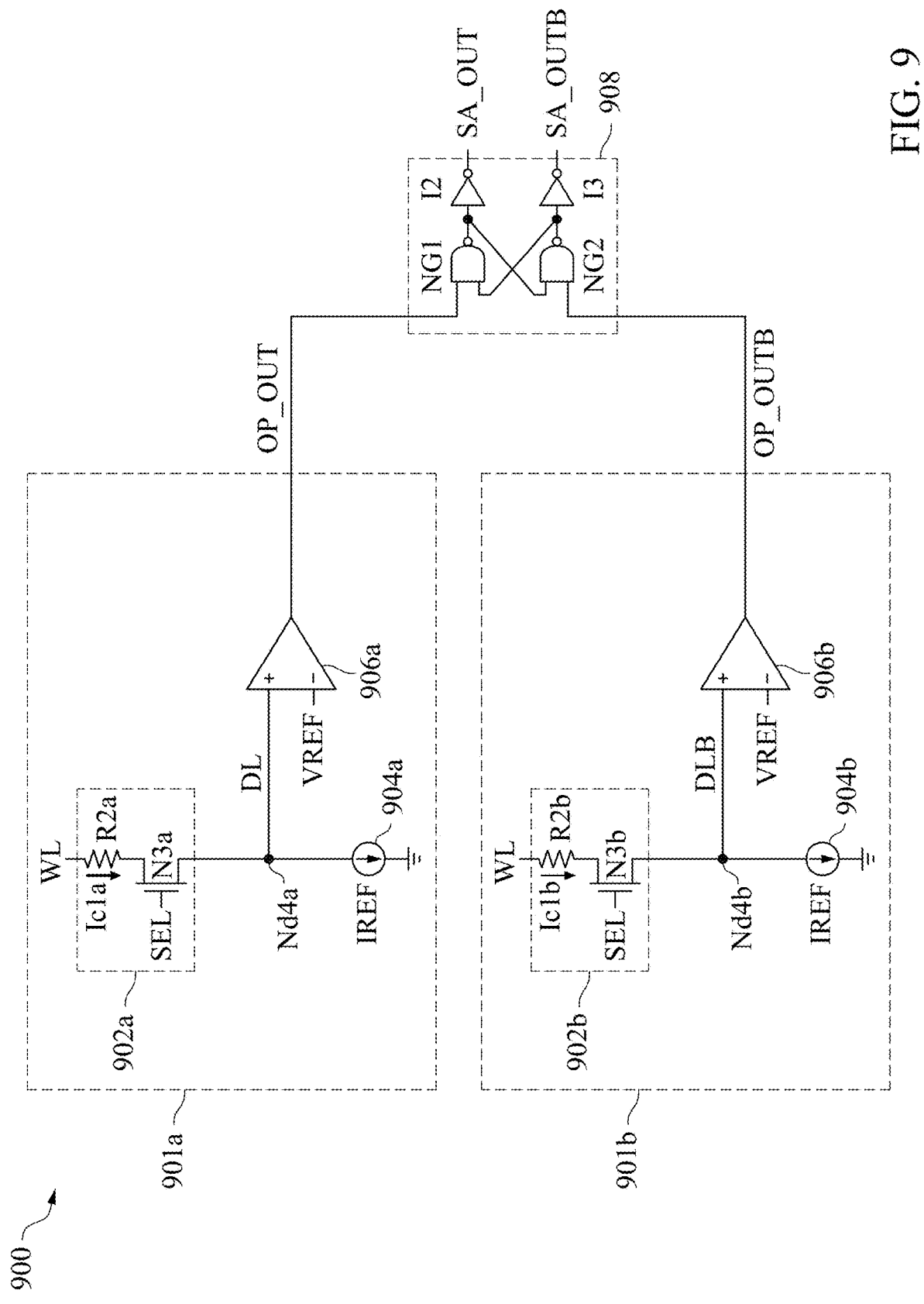
FIG. 9 is a circuit diagram of a circuit, in accordance with some embodiments.

FIG. 9 is a circuit diagram of a circuit 900, in accordance with some embodiments.

Circuit 900 is an embodiment of at least read/program circuit 102U or 102L of FIG. 1 or read circuit 204a and memory cell 220a1 of FIG. 2, and similar detailed description is therefore omitted.

Circuit 900 is a variation of circuit 400 of FIG. 4, and similar detailed description is therefore omitted. For example, circuit 900 is a pseudo-differential sensing circuit using a pair of single-end sense amplifiers (e.g., sense amplifier 901a and sense amplifier 901b) in a differential manner.

Circuit 900 includes sense amplifier 901a, sense amplifier 901b and a latch 908. Sense amplifier 901a and sense amplifier 901b are coupled to the latch 908.

Sense amplifier 901a and sense amplifier 901b are similar to circuit 400 of FIG. 4, and similar detailed description is therefore omitted. In comparison with circuit 400 of FIG. 4, at least sense amplifier 901a or 901b does not include detection circuit 408, and similar detailed description is therefore omitted.

Sense amplifier 901a includes a memory cell 902a, a current source 904a and a comparator 906a. Sense amplifier 901b is a single-end sense amplifier. Sense amplifier 901a is configured to read data stored in memory cell 902a.

In some embodiments, memory cell 902a is similar to memory cell 402 of FIG. 4, current source 904a is similar to current source 404 of FIG. 4, comparator 906a is similar to comparator 406 of FIG. 4, node Nd4a is similar to node Nd3 of FIG. 4, voltage DL of FIG. 9 is similar to voltage DL of FIG. 4, signal OP_OUT is similar to output signal SA_OUT1 of FIG. 4, cell current Ida is similar to cell current Icell of FIG. 4, resistor R2a is similar to resistor R1 of FIG. 4, NMOS transistor N3a is similar to NMOS transistor N1 of FIG. 4, and similar detailed description is therefore omitted.

In comparison with circuit 400 of FIG. 4, the output terminal of comparator 906a is not electrically coupled or fed back to at least node Nd4a, the non-inverting input terminal of comparator 906a, the first end of current source 904a or memory cell 902a.

Sense amplifier 901b includes a memory cell 902b, a current source 904b and a comparator 906b. Sense amplifier 901b is a single-end sense amplifier. Sense amplifier 901b is configured to read data stored in memory cell 902b.

In some embodiments, memory cell 902b is similar to memory cell 402 of FIG. 4, current source 904b is similar to current source 404 of FIG. 4, comparator 906b is similar to comparator 406 of FIG. 4, node Nd4b is similar to node Nd3 of FIG. 4, voltage DLB of FIG. 9 is similar to voltage DL of FIG. 4, signal OP_OUTB is similar to output signal SA_OUT1 of FIG. 4, cell current Ic1b is similar to cell current Icell of FIG. 4, resistor R2b is similar to resistor R1 of FIG. 4, NMOS transistor N3b is similar to NMOS transistor N1 of FIG. 4, and similar detailed description is therefore omitted.

In comparison with circuit 400 of FIG. 4, the output terminal of comparator 906b is not electrically coupled or fed back to at least node Nd4b, the non-inverting input terminal of comparator 906b, the first end of current source 904b or memory cell 902b.

In some embodiments, memory cell 902a and 902b are configured to store complementary data values (logic 0 and logic 1), and sense amplifiers 901a and 901b are configured to sense the complementary data values (logic 0 and logic 1) in a differential manner. In some embodiments, signal OP_OUTB is inverted from signal OP_OUT and vice versa.

Latch 908 is coupled to an output terminal of comparator 906a and an output terminal of comparator 906b. Latch 908 is configured to receive signal OP_OUT from the output terminal of comparator 906a and signal OP_OUTB from the output terminal of comparator 906b.

Latch 908 is configured to generate output signal SA_OUT and output signal SA_OUTB in response to at least signal OP_OUT or signal OP_OUTB. In some embodiments, latch 908 is configured to latch signal OP_OUT or signal OP_OUTB.

In some embodiments, latch 908 is a NAND SR latch. Other types of latches or configurations for at least latch 908 are within the scope of the present disclosure. In some embodiments, latch 908 includes a SR NOR latch, SR AND-OR latch, a JK latch, or the like.

Latch 908 includes a NAND logic gate NG1, a NAND logic gate NG2, an inverter I2 and an inverter I3.

NAND logic gate NG1 is coupled to the output terminal of comparator 906a, an output terminal of NAND logic gate NG2 and an input terminal of inverter I2.

NAND logic gate NG1 is configured to generate output signal SA_OUT1 in response to output signal SA_OUTB1 and signal OP_OUT.

A first input terminal of NAND logic gate NG1 is coupled to the output terminal of comparator 906a, and is configured to receive signal OP_OUT.

A second input terminal of NAND logic gate NG1 is coupled to at least the output terminal of NAND logic gate NG2, and is configured to receive output signal SA_OUTB1.

An output terminal of NAND logic gate NG1 is coupled to the input terminal of inverter I2, and is configured to output the output signal SA_OUT1.

NAND logic gate NG2 is coupled to the output terminal of comparator 906b, an output terminal of NAND logic gate NG1 and an input terminal of inverter I3.

NAND logic gate NG2 is configured to generate output signal SA_OUTB1 in response to output signal SA_OUT1 and signal OP_OUTB.

A first input terminal of NAND logic gate NG2 is coupled to the output terminal of comparator 906b, and is configured to receive signal OP_OUTB.

A second input terminal of NAND logic gate NG2 is coupled to at least the output terminal of NAND logic gate NG1, and is configured to receive output signal SA_OUT1.

An output terminal of NAND logic gate NG2 is coupled to the input terminal of inverter I3, and is configured to output the output signal SA_OUTB1.

Inverter I2 is configured to generate the output signal SA_OUT in response to the output signal SA_OUT1. In some embodiments, output signal SA_OUT is inverted from the output signal SA_OUT1 and vice versa.

An input terminal of inverter I2 is coupled to the output terminal of NAND logic gate NG1. The input terminal of inverter I2 is configured to receive output signal SA_OUT1 from NAND logic gate NG1.

An output terminal of inverter I2 is configured to output the output signal SA_OUT.

Inverter I3 is configured to generate the output signal SA_OUTB in response to the output signal SA_OUTB1. In some embodiments, output signal SA_OUTB is inverted from the output signal SA_OUTB1 and vice versa.

An input terminal of inverter I3 is coupled to the output terminal of NAND logic gate NG2. The input terminal of inverter I3 is configured to receive output signal SA_OUTB1 from NAND logic gate NG2.

An output terminal of inverter I3 is configured to output the output signal SA_OUTB.

Other configurations of inverters or number of inverters in latch circuit 908 are within the scope of the present disclosure. Other configurations of logic gates, number of logic gates or logic gate types in latch circuit 908 are within the scope of the present disclosure.

In some embodiments, prior to storage of data values, memory cells 902a and 902b are referred to as "virgin cells." In other words, un-programmed memory cells are referred to as "virgin memory cells." In some embodiments, circuit 900 is usable to screen or detect virgin memory cells while using a pseudo-differential sensing manner. For example, during a read operation of memory cells 902a and 902b, corresponding resistor R2a, R2b are electrically coupled to at least corresponding node Nd4a, Nd4b by corresponding NMOS transistor N3a, N3b in response to select signal SEL. During the read operation of memory cells 902a and 902b, initially the voltage of the word line WL is 0, and the cell current Ic1a, Ic1b in corresponding memory cells 902a, 902b is 0, thereby causes the voltage DL, DLB of corresponding node Nd4a, Nd4b to be less than the reference voltage VREF, and the corresponding comparator 906a, 906b is configured to generate the corresponding signal OP_OUT, OP_OUTB having a logic 0. In response to signal OP_OUT, OP_OUTB having a logic 0, the latch 908 outputs corresponding signal SA_OUT1, SAOUTB1 having a logic 0.

In this non-limiting example, as the voltage of the word line WL rises, the cell current Id1a, Ic1b in corresponding memory cells 902a, 902b rises, thereby causing the corresponding voltage DL, DLB of corresponding node Nd4a, Nd4b to rise, but still be less than the reference voltage VREF, and the corresponding comparator 906a, 906b is configured to generate the corresponding signal OP_OUT, OP_OUTB having a logic 0. In response to signal OP_OUT, OP_OUTB having a logic 0, the latch 908 outputs corresponding signal SA_OUT1, SAOUTB1 having a logic 0. Thus, in this non-limiting example, circuit 900 is usable to screen or detect virgin memory cells while using a pseudo-differential sensing manner.

In some embodiments, memory cell 902a and 902b are configured to store complementary data values (logic 0 and logic 1), and sense amplifiers 901a and 901b are configured to sense the complementary data values (logic 0 and logic 1) in a pseudo-differential manner. In some embodiments, signal OP_OUT is inverted from signal OP_OUTB and vice versa.

By way of an illustrative example, if memory cell 902a is configured to store a logic 0, then resistor R2a has a high resistance state, and if memory cell 902b is configured to store a logic 1 then resistor R2b has a low resistance state.

During a read operation of memory cell 902a storing a logic 0, and memory cell 902b storing a logic 1, initially the voltage of the word line WL is 0, and the initial behavior of circuit 900 is similar to the description above where circuit 900 is usable to screen or detect virgin memory cells while using a pseudo-differential sensing manner and is omitted for brevity.

During the read operation of memory cell 902a storing a logic 0, and memory cell 902b storing a logic 1, as the voltage of the word line WL rises, the cell current Id1a, Ic1b in corresponding memory cells 902a, 902b rises, thereby causing the corresponding voltage DL, DLB of corresponding node Nd4a, Nd4b to rise.

Since resistor R2a has a high resistance state, the cell current Ida is still less than the reference voltage VREF, and the voltage DL of node Nd4a is less than the reference voltage VREF thereby causing comparator 906a to generate signal OP_OUT having a logic 0. Since resistor R2b has a low resistance state, the cell current Ic1b is greater than the reference voltage VREF, and the voltage DLB of node Nd4b is greater than the reference voltage VREF thereby causing comparator 906b to generate signal OP_OUT having a logic 1. In response to signal OP_OUT having a logic 0 and signal OP_OUT having a logic 1, latch 908 is configured to output the output signal SA_OUT1 to be a logic 0 and the output signal SAOUTB1 to be a logic 1.

By way of another illustrative example, if memory cell 902a is configured to store a logic 1, then resistor R2a has a low resistance state, and if memory cell 902b is configured to store a logic 0 then resistor R2b has a high resistance state.

During a read operation of memory cell 902a storing a logic 1, and memory cell 902b storing a logic 0, initially the voltage of the word line WL is 0, and the initial behavior of circuit 900 is similar to the description above where circuit 900 is usable to screen or detect virgin memory cells while using a pseudo-differential sensing manner and is omitted for brevity.

During the read operation of memory cell 902a storing a logic 1, and memory cell 902b storing a logic 0, as the voltage of the word line WL rises, the cell current Id1a, Ic1b in corresponding memory cells 902a, 902b rises, thereby causing the corresponding voltage DL, DLB of corresponding node Nd4a, Nd4b to rise.

Since resistor R2a has a low resistance state, the cell current Ida is greater than the reference voltage VREF, and the voltage DL of node Nd4a is greater than the reference voltage VREF thereby causing comparator 906a to generate signal OP_OUT having a logic 1. Since resistor R2b has a high resistance state, the cell current Ic1b is still less than the reference voltage VREF, and the voltage DLB of node Nd4b is less than the reference voltage VREF thereby causing comparator 906b to generate signal OP_OUTB having a logic 0. In response to signal OP_OUT having a logic 1 and signal OP_OUT having a logic 0, latch 908 is configured to output the output signal SA_OUT1 to be a logic 1 and the output signal SAOUTB1 to be a logic 0.

Thus, in these non-limiting examples, circuit 900 is usable to correctly detect or read the data stored in at least memory cell 902a or 902b by using the sense amplifiers 901a and 901b in a pseudo-differential sensing manner with an enlarged sensing window, but still being able to sense or detect virgin memory cells.

Figure 10:
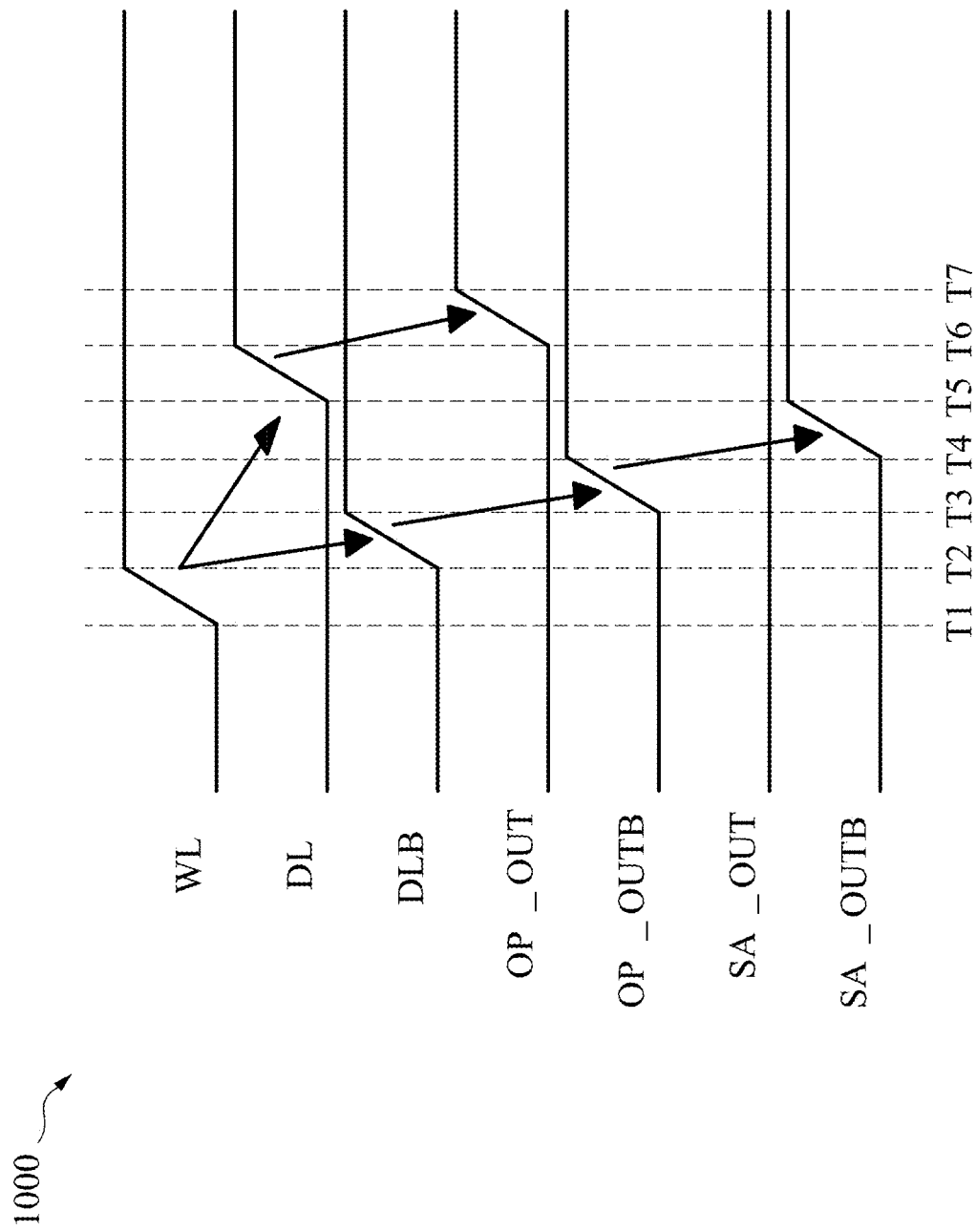
FIG. 10 is a timing diagram of waveforms of a circuit, such as the circuit in FIG. 9, in accordance with some embodiments.

FIG. 10 is a timing diagram 1000 of waveforms of a circuit, such as circuit 900 in FIG. 9, in accordance with some embodiments.

Figure 11:
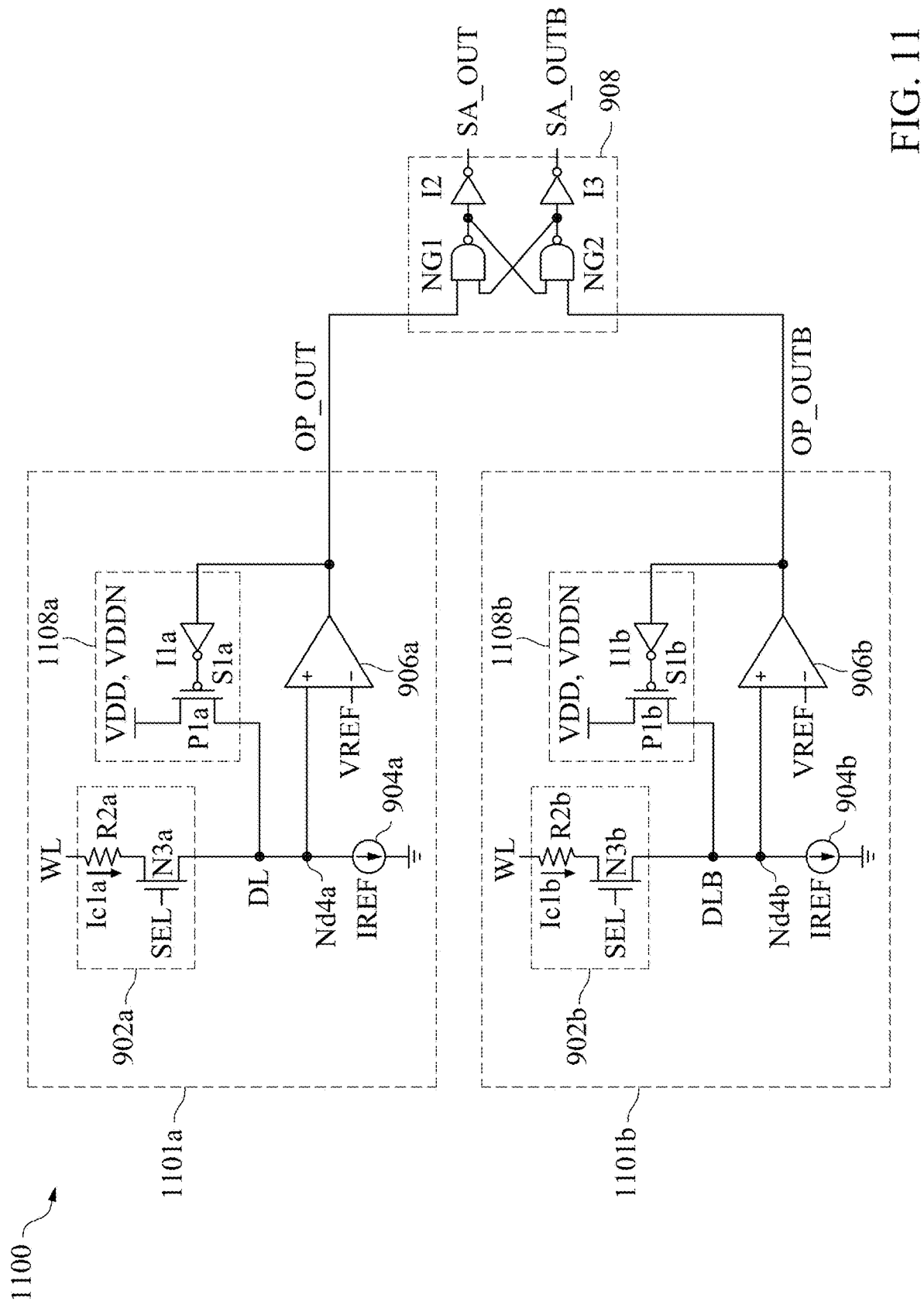
FIG. 11 is a circuit diagram of a circuit, in accordance with some embodiments.
Figure 12:
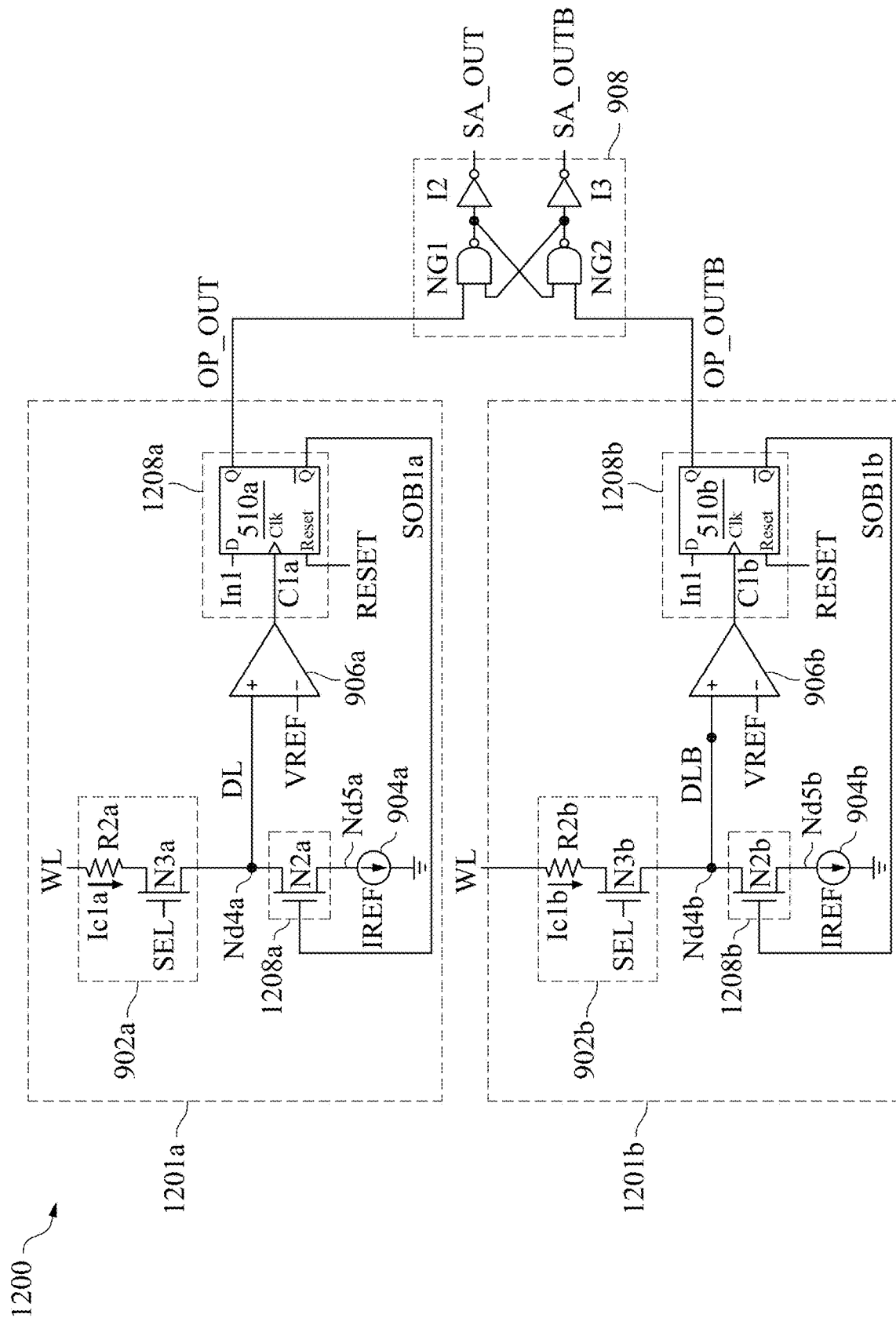
FIG. 12 is a circuit diagram of a circuit, in accordance with some embodiments.
Figure 13:
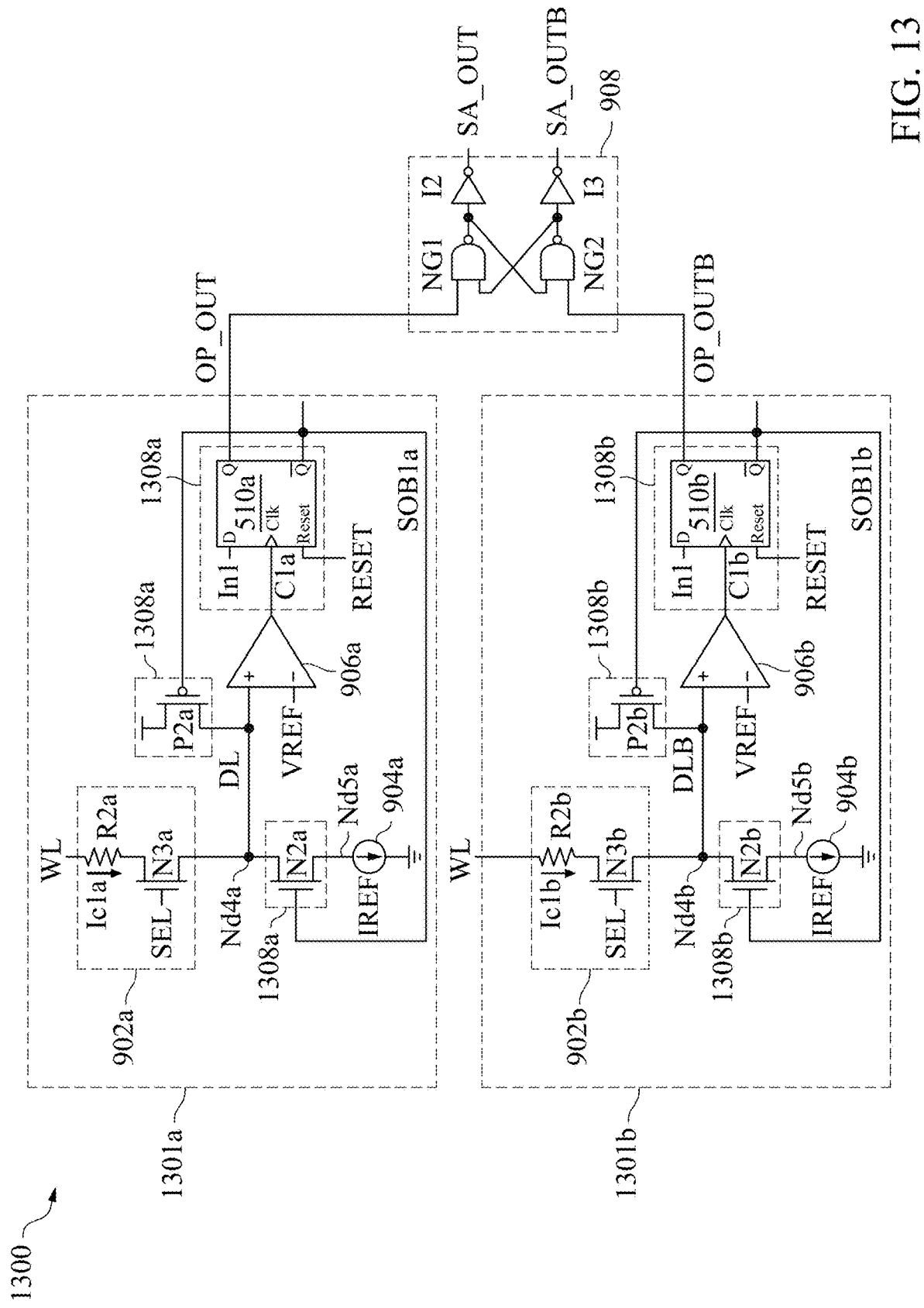
FIG. 13 is a circuit diagram of a circuit, in accordance with some embodiments.

In some embodiments, FIG. 10 is a timing diagram 1000 of waveforms of at least circuit 1100-1300 in FIGS. 11-13, in accordance with some embodiments.

In some embodiments, timing diagram 1000 corresponds to waveforms of circuit 900 during a read operation of memory cell 902a and 902b, and a read disturb results. For example, if memory cell 902a is configured to store a logic 0, then resistor R2a has a high resistance state, and if memory cell 902b is configured to store a logic 1, then resistor R2b has a low resistance state. However, if the resistance state of memory cell 902a is different than expected where a read operation of memory cell 902a results in a logic 1 rather than a logic 0, then this behavior corresponds to a read disturb. However, circuit 900 is able to overcome to read disturbs.

Prior to time T1, cell currents Ida and Ic1b are 0, and the output signals SA_OUT and SA_OUTB are both logic 0.

At time T1, the voltage of the word line WL transitions from logic 0 to logic 1.

At time T2, the voltage of the word line WL is at logic 1.

At time T2, in response to the transition of the word line voltage WL, the voltage DLB of node ND4b begins to rise and transitions from logic 0 to logic 1. At time T2, since the resistance R2a of memory cell 902a is greater than the resistance R2b of memory cell 902b, the voltage DL of node Nd4a is not yet affected by the rising voltage of the word line WL, and the voltage of DL of node Nd4a remains at logic 0.

At time T3, the voltage DLB of node ND4b is a logic 1. At time T3, signal OP_OUTB (e.g., generated by comparator 906b) begins to transition from logic 0 to logic 1 in response to the voltage DLB of node Nd4b being greater than the reference voltage VREF. At time T3, signal OP_OUT (e.g., generated by comparator 906a) remains at logic 0 since the voltage DL of node Nd4a is less than the reference voltage VREF.

At time T4, signal OP_OUTB is a logic 1, and signal OP_OUT is a logic 0. At time T4, in response to signal OP_OUTB transitioning to a logic 1 and signal OP_OUT being a logic 0, output signal SA_OUTB (e.g., generated by latch 908) begins to transition from logic 0 to logic 1 and output signal SA_OUT (e.g., generated by latch 908) remains at logic 0.

At time T5, output signal SA_OUTB is a logic 1, and output signal SA_OUT is a logic 0. At time T5, the voltage DL of node Nd4a begins to rise and transition from logic 0 to logic 1 in response to the rising voltage of the word line WL from time T1-T2.

At time T6, the voltage DL of node Nd4a is a logic 1. At time T6, signal OP_OUT (e.g., generated by comparator 906a) begins to transition from logic 0 to logic 1 in response to the voltage DL of node Nd4a being greater than the reference voltage VREF. At time T6, signal OP_OUTB (e.g., generated by comparator 906b) remains at logic 1.

At time T7, signal OP_OUT is a logic 1, and signal OP_OUTB is a logic 1. However, at time T7, in response to signal OP_OUT transitioning to a logic 1 and signal OP_OUT being a logic 1, output signal SA_OUT (e.g., generated by latch 908) remains at logic 0 and output signal SA_OUTB (e.g., generated by latch 908) remains at logic 1 since the last state of latch 908 is kept or maintained when both inputs are logic 1. Thus, the read disturb of memory cell 902a does not affect circuit 900, and circuit 900 is able to correctly read the data stored in memory cells 902a and 902b, and is further able to achieve one or more benefits described herein.

Other waveforms of circuit 900 or timing diagrams 1000 are within the scope of the present disclosure.

FIG. 11 is a circuit diagram of a circuit 1100, in accordance with some embodiments.

Circuit 1100 is an embodiment of at least read/program circuit 102U or 102L of FIG. 1 or read circuit 204a and memory cell 220a1 of FIG. 2, and similar detailed description is therefore omitted.

Circuit 1100 is a variation of circuit 400 of FIG. 4 and circuit 900 of FIG. 9, and similar detailed description is therefore omitted. For example, each of sense amplifiers 1101a and 1101b of FIG. 11 correspond to circuit 400 of FIG. 4, and sense amplifiers 1101a and 1101b are useable as corresponding sense amplifiers 901a and 901b of FIG. 9, and similar detailed description is therefore omitted.

In some embodiments, circuit 1100 is a pseudo-differential sensing circuit using a pair of single-end sense amplifiers (e.g., sense amplifier 1101a and sense amplifier 1101b) in a differential manner.

Circuit 1100 includes sense amplifier 1101a, sense amplifier 1101b and latch 908. Sense amplifier 1101a and sense amplifier 1101b are coupled to the latch 908.

In comparison with circuit 900 of FIG. 9, sense amplifier 1101a replaces sense amplifier 901a of FIG. 9, and sense amplifier 1101b replaces sense amplifier 901b of FIG. 9, and similar detailed description is therefore omitted.

Each of sense amplifier 1101a and sense amplifier 1101b correspond to circuit 400 of FIG. 4, and similar detailed description is therefore omitted.

Sense amplifier 1101a includes memory cell 902a, current source 904a, comparator 906a and detection circuit 1108a.

Sense amplifier 1101b includes memory cell 902b, current source 904b, comparator 906b and detection circuit 1108b. Each of sense amplifiers 1101a and 1101b is a single-end sense amplifier.

Detection circuit 1108a is similar to detection circuit 408 of FIG. 4, detection circuit 1108b is similar to detection circuit 408 of FIG. 4, signal OP_OUT is similar to output signal SA_OUT1 of FIG. 4, and signal OP_OUTB is similar to output signal SA_OUT1 of FIG. 4, and similar detailed description is therefore omitted.

Detection circuit 1108a includes an inverter I1a and a PMOS transistor P1a. In comparison with circuit 400 of FIG. 4, inverter I1a is similar to inverter I1 of FIG. 4, PMOS transistor P1a is similar to PMOS transistor P1 of FIG. 4, and signal S1a is similar to signal SOB1 of FIG. 4, and similar detailed description is therefore omitted.

In comparison with circuit 400 of FIG. 4 and circuit 900 of FIG. 9, the output terminal of comparator 906a is further electrically coupled to an input terminal of inverter I1a, a drain terminal of PMOS transistor P1a is coupled to node Nd4a, the non-inverting input terminal of comparator 906a, the first end of current source 904a and memory cell 902a.

Detection circuit 1108b includes an inverter I1b and a PMOS transistor P1b. In comparison with circuit 400 of FIG. 4, inverter I1b is similar to inverter I1 of FIG. 4, PMOS transistor P1b is similar to PMOS transistor P1 of FIG. 4, and signal S1b is similar to signal SOB1 of FIG. 4, and similar detailed description is therefore omitted.

In comparison with circuit 400 of FIG. 4 and circuit 900 of FIG. 9, the output terminal of comparator 906b is further electrically coupled to an input terminal of inverter I1b, a drain terminal of PMOS transistor P1b is coupled to node Nd4b, the non-inverting input terminal of comparator 906b, the first end of current source 904b and memory cell 902b.

Other configurations of detection circuit 1108a or 1108b or types of circuits within detection circuit 1108a or 1108b are within the scope of the present disclosure.

Other configurations of logic gates, number of logic gates or logic gate types in latch circuit 908 are within the scope of the present disclosure.

Other configurations of transistors, number of transistors or transistor types of circuit 1100 are within the scope of the present disclosure.

In some embodiments, circuit 1100 is able to correctly detect or read the data stored in at least memory cell 902a or 902b by using the sense amplifiers 1101a and 1101b in a pseudo-differential sensing manner with an enlarged sensing window, but still being able to sense or detect virgin memory cells. In some embodiments, circuit 1100 operates to achieve one or more benefits described herein including the details discussed above with respect to circuit 400.

FIG. 12 is a circuit diagram of a circuit 1200, in accordance with some embodiments.

Circuit 1200 is an embodiment of at least read/program circuit 102U or 102L of FIG. 1 or read circuit 204a and memory cell 220a1 of FIG. 2, and similar detailed description is therefore omitted.

Circuit 1200 is a variation of circuit 500 of FIG. 5 and circuit 900 of FIG. 9, and similar detailed description is therefore omitted. For example, each of sense amplifiers 1201a and 1201b of FIG. 12 correspond to circuit 500 of FIG. 5, and sense amplifiers 1201a and 1201b are useable as corresponding sense amplifiers 901a and 901b of FIG. 9, and similar detailed description is therefore omitted.

In some embodiments, circuit 1200 is a pseudo-differential sensing circuit using a pair of single-end sense amplifiers (e.g., sense amplifier 1201a and sense amplifier 1201b) in a differential manner.

Circuit 1200 includes sense amplifier 1201a, sense amplifier 1201b and latch 908. Sense amplifier 1201a and sense amplifier 1201b are coupled to the latch 908.

In comparison with circuit 900 of FIG. 9, sense amplifier 1201a replaces sense amplifier 901a of FIG. 9, and sense amplifier 1201b replaces sense amplifier 901b of FIG. 9, and similar detailed description is therefore omitted.

Each of sense amplifier 1201a and sense amplifier 1201b correspond to circuit 500 of FIG. 5, and similar detailed description is therefore omitted.

Sense amplifier 1201a includes memory cell 902a, current source 904a, comparator 906a and detection circuit 1208a.

Sense amplifier 1201b includes memory cell 902b, current source 904b, comparator 906b and detection circuit 1208b. Each of sense amplifiers 1201a and 1201b is a single-end sense amplifier.

Detection circuit 1208a is similar to detection circuit 508 of FIG. 5, detection circuit 1208b is similar to detection circuit 508 of FIG. 5, signal OP_OUT is similar to output signal SA_OUT of FIG. 5, and signal OP_OUTB is similar to output signal SA_OUT of FIG. 5, and similar detailed description is therefore omitted.

Detection circuit 1208a includes an NMOS transistor N2a and a flip-flop 510a. In comparison with circuit 500 of FIG. 5, NMOS transistor N2a is similar to NMOS transistor N2 of FIG. 5, flip-flop 510a is similar to flip-flop 510 of FIG. 5, and signal SOB1a is similar to signal SOB of FIG. 5, and similar detailed description is therefore omitted.

In comparison with circuit 500 of FIG. 5 and circuit 900 of FIG. 9, the output terminal of comparator 906a is further electrically coupled to a clock input terminal CLK of flip-flop 510a, a first output terminal Q of flip-flop 510a is electrically coupled to the first input terminal of NAND logic gate NG1, a drain terminal of NMOS transistor N2a is coupled to node Nd4a, the non-inverting input terminal of comparator 906a and memory cell 902a, and a source of NMOS transistor N2a is coupled to the first end of current source 904a.

Detection circuit 1208b includes an NMOS transistor N2b and a flip-flop 510b. In comparison with circuit 500 of FIG. 5, NMOS transistor N2b is similar to NMOS transistor N2 of FIG. 5, flip-flop 510b is similar to flip-flop 510 of FIG. 5, and signal SOB1b is similar to signal SOB of FIG. 5, and similar detailed description is therefore omitted.

In comparison with circuit 500 of FIG. 5 and circuit 900 of FIG. 9, the output terminal of comparator 906b is further electrically coupled to a clock input terminal CLK of flip-flop 510b, a first output terminal Q of flip-flop 510b is electrically coupled to the first input terminal of NAND logic gate NG2, a drain terminal of NMOS transistor N2b is coupled to node Nd4b, the non-inverting input terminal of comparator 906b and memory cell 902b, and a source of NMOS transistor N2b is coupled to the first end of current source 904b.

Other configurations of detection circuit 1208a or 1208b or types of circuits within detection circuit 1208a or 1208b are within the scope of the present disclosure.

Other configurations of logic gates, number of logic gates or logic gate types in latch circuit 908 are within the scope of the present disclosure.

Other configurations of transistors, number of transistors or transistor types of circuit 1200 are within the scope of the present disclosure.

In some embodiments, circuit 1200 is able to correctly detect or read the data stored in at least memory cell 902a or 902b by using the sense amplifiers 1201a and 1201b in a pseudo-differential sensing manner with an enlarged sensing window, but still being able to sense or detect virgin memory cells. In some embodiments, circuit 1200 operates to achieve one or more benefits described herein including the details discussed above with respect to circuit 500.

FIG. 13 is a circuit diagram of a circuit 1300, in accordance with some embodiments.

Circuit 1300 is an embodiment of at least read/program circuit 102U or 102L of FIG. 1 or read circuit 204a and memory cell 220a1 of FIG. 2, and similar detailed description is therefore omitted.

Circuit 1300 is a variation of circuit 600 of FIG. 6, circuit 900 of FIG. 9, and circuit 1200 of FIG. 12, and similar detailed description is therefore omitted. For example, each of sense amplifiers 1301a and 1301b of FIG. 13 correspond to circuit 600 of FIG. 6, and sense amplifiers 1301a and 1301b are useable as corresponding sense amplifiers 901a and 901b of FIG. 9, and similar detailed description is therefore omitted.

In comparison with circuit 1200 of FIG. 12, circuit 1300 further includes PMOS transistors P2a and P2b, and similar detailed description is therefore omitted.

In some embodiments, circuit 1300 is a pseudo-differential sensing circuit using a pair of single-end sense amplifiers (e.g., sense amplifier 1301a and sense amplifier 1301b) in a differential manner.

Circuit 1300 includes sense amplifier 1301a, sense amplifier 1301b and latch 908. Sense amplifier 1301a and sense amplifier 1301b are coupled to the latch 908.

In comparison with circuit 900 of FIG. 9, sense amplifier 1301a replaces sense amplifier 901a of FIG. 9, and sense amplifier 1301b replaces sense amplifier 901b of FIG. 9, and similar detailed description is therefore omitted.

Each of sense amplifier 1301a and sense amplifier 1301b correspond to circuit 600 of FIG. 6, and similar detailed description is therefore omitted.

Sense amplifier 1301a includes memory cell 902a, current source 904a, comparator 906a and detection circuit 1308a.

Sense amplifier 1301b includes memory cell 902b, current source 904b, comparator 906b and detection circuit 1308b. Each of sense amplifiers 1301a and 1301b is a single-end sense amplifier.

Detection circuit 1308a is similar to detection circuit 608 of FIG. 6, detection circuit 1308b is similar to detection circuit 608 of FIG. 6, signal OP_OUT is similar to output signal SA_OUT of FIG. 6, and signal OP_OUTB is similar to output signal SA_OUT of FIG. 6, and similar detailed description is therefore omitted.

Detection circuit 1308a includes NMOS transistor N2a, flip-flop 510a and a PMOS transistor P2a. In comparison with circuit 600 of FIG. 6, NMOS transistor N2a is similar to NMOS transistor N2 of FIG. 6, flip-flop 510a is similar to flip-flop 510 of FIG. 6, signal SOB1a is similar to signal SOB of FIG. 6, and PMOS transistor P2a is similar to PMOS transistor P2 of FIG. 6, and similar detailed description is therefore omitted.

In comparison with circuit 600 of FIG. 6 and circuit 1200 of FIG. 12, a drain terminal of PMOS transistor P2a is coupled to node Nd4a, the non-inverting input terminal of comparator 906a, memory cell 902a and the drain terminal of NMOS transistor N2a.

Detection circuit 1308b includes NMOS transistor N2b, flip-flop 510b and a PMOS transistor P2b. In comparison with circuit 600 of FIG. 6, NMOS transistor N2b is similar to NMOS transistor N2 of FIG. 6, flip-flop 510b is similar to flip-flop 510 of FIG. 6, signal SOB1b is similar to signal SOB of FIG. 6, and PMOS transistor P2b is similar to PMOS transistor P2 of FIG. 6, and similar detailed description is therefore omitted.

In comparison with circuit 600 of FIG. 6 and circuit 1200 of FIG. 12, a drain terminal of PMOS transistor P2b is coupled to node Nd4b, the non-inverting input terminal of comparator 906b, memory cell 902b and the drain terminal of NMOS transistor N2b.

Other configurations of detection circuit 1308a or 1308b or types of circuits within detection circuit 1308a or 1308b are within the scope of the present disclosure.

Other configurations of logic gates, number of logic gates or logic gate types in latch circuit 908 are within the scope of the present disclosure.

Other configurations of transistors, number of transistors or transistor types of circuit 1300 are within the scope of the present disclosure.

In some embodiments, circuit 1300 is able to correctly detect or read the data stored in at least memory cell 902a or 902b by using the sense amplifiers 1301a and 1301b in a pseudo-differential sensing manner with an enlarged sensing window, but still being able to sense or detect virgin memory cells. In some embodiments, circuit 1300 operates to achieve one or more benefits described herein including the details discussed above with respect to circuit 600.

Figure 14:
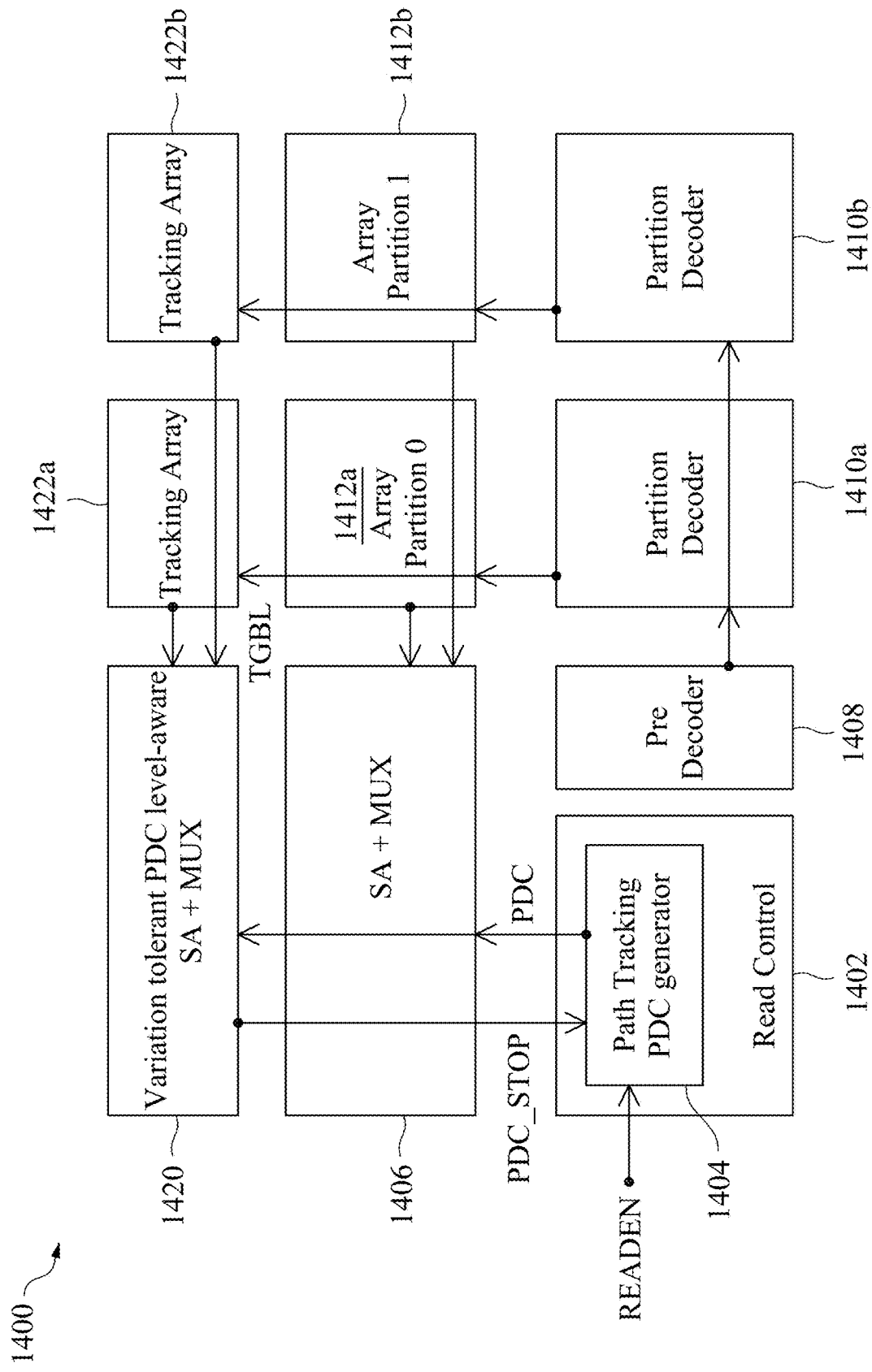
FIG. 14 is a block diagram of a memory circuit, in accordance with some embodiments.

FIG. 14 is a block diagram of a memory circuit 1400, in accordance with some embodiments.

FIG. 14 is simplified for the purpose of illustration. In some embodiments, memory circuit 1400 includes various elements in addition to those depicted in FIG. 14 or is otherwise arranged so as to perform the operations discussed below.

Memory circuit 1400 is an embodiment of a portion of memory circuit 100 of FIG. 1, and similar detailed description is therefore omitted. For example, memory circuit 1400 is an embodiment of at least memory partition 102A and 102B of FIG. 1, and similar detailed description is therefore omitted.

Circuit 1400 includes a read control circuit 1402, a SA/MUX 1406, a pre-decoder 1408, a partition decoder 1410a, a partition decoder 1410b, an array partition 1412a, an array partition 1412b, a SA/MUX 1420, a tracking array 1422a and a tracking array 1422b.

In some embodiments, read control circuit 1402 corresponds to circuit 100F of FIG. 1, SA/MUX 1406 corresponds to Read/Program circuit 102U or 102L of FIG. 1 or Read/Program circuit 202 and multiplexer 212a of FIG. 2, pre-decoder 1408 corresponds to BL selection circuit 110BS in memory partitions 102A and 102B of FIG. 1, partition decoder 1410a corresponds to bank decoder circuit 110DC in memory partition 102A of FIG. 1, partition decoder 1410b corresponds to bank decoder circuit 110DC in memory partition 102B of FIG. 1, array partition 1412a corresponds to memory partition 102A of FIG. 1, and array partition 1412b corresponds to memory partition 102B of FIG. 1, and similar detailed description is therefore omitted.

Read control circuit 1402 is configured to control read operations of memory cells in array partitions 1412a and 1412b. Read control circuit 1402 is configured to receive a read enable signal READEN. In some embodiments, read control circuit 1402 is configured to generate one or more control signals (not shown) for performing one or more read operations of array partitions 1412a and 1412b in response to the read enable signal READEN. In some embodiments, the read enable signal READEN corresponds to the read enable signal READEN of FIGS. 7A-7C & 8, and similar detailed description is therefore omitted.

Read control circuit 1402 includes a pre-discharge control (PDC) generator circuit 1404.

PDC generator circuit 1404 is configured to receive the read enable signal READEN and a control signal PDC_STOP. PDC generator circuit 1404 is configured to generate a pre-discharge control signal PDC. In some embodiments, the pre-discharge control signal PDC corresponds to the reset data line signal RST_DL of FIGS. 7A-7C & 8, and similar detailed description is therefore omitted.

In some embodiments, PDC generator circuit 1404 is configured to generate the pulse control signal PDC in response to at least the read enable signal READEN or control signal PDC_STOP. In some embodiments, PDC generator circuit 1404 is configured to generate a leading edge of the pulse control signal PDC in response to the read enable signal READEN, and is configured to generate a trailing edge of the pulse control signal PDC in response to the control signal PDC_STOP. In some embodiments, the leading edge and the trailing edge of the pre-discharge control signal PDC define the pulse width of the pre-discharge control signal PDC. In some embodiments, the pre-discharge control signal PDC is useable by the SA/MUX 406 to track the discharge of a tracking bit line voltage TGBL of the dummy global bit line GBLDMY. In some embodiments, the discharge of the tracking bit line voltage TGBL of the dummy global bit line GBLDMY corresponds to the discharge stage (e.g., reset data line) of a read operation as shown in FIGS. 7A-7C & 8, and similar detailed description is therefore omitted.

SA/MUX 1406 is a sense amplifier and multiplexer coupled to array partitions 1412a and 1412b. In some embodiments, at least circuit 400, 500, 600, 700, 900, 1100, 1200 or 1300 are useable as SA/MUX 1406, and similar detailed description is therefore omitted. In some embodiments, SA/MUX 1406 is Read/Program circuit 102U or 102L or Read/Program circuit 202 and multiplexer 212a, and similar detailed description is therefore omitted.

Pre-decoder 1408 is a pre-decoder circuit configured to pre-decode portions of addresses in at least partition decoder 1410a or partition decoder 1410b. In some embodiments, the pre-decodes portions of addresses in at least partition decoder 1410a or partition decoder 1410b identify rows of decoder circuits in at least corresponding partition decoder 1410a or 1410b.

Partition decoder 1410a is configured to generate enable signals corresponding to adjacent subsets of NVM devices identified by the one or more address signals in array partition 1412a. In some embodiments, the adjacent subsets of NVM devices correspond to rows or columns of NVM devices in array partition 1412a. In some embodiments, partition decoder 1410a is configured to output the enable signals to adjacent memory banks of the array partition 1412a.

Partition decoder 1410b is configured to generate enable signals corresponding to adjacent subsets of NVM devices identified by the one or more address signals in array partition 1412b. In some embodiments, the adjacent subsets of NVM devices correspond to rows or columns of NVM devices in array partition 1412b. In some embodiments, partition decoder 1410b is configured to output the enable signals to adjacent memory banks of the array partition 1412b.

Figure 15:
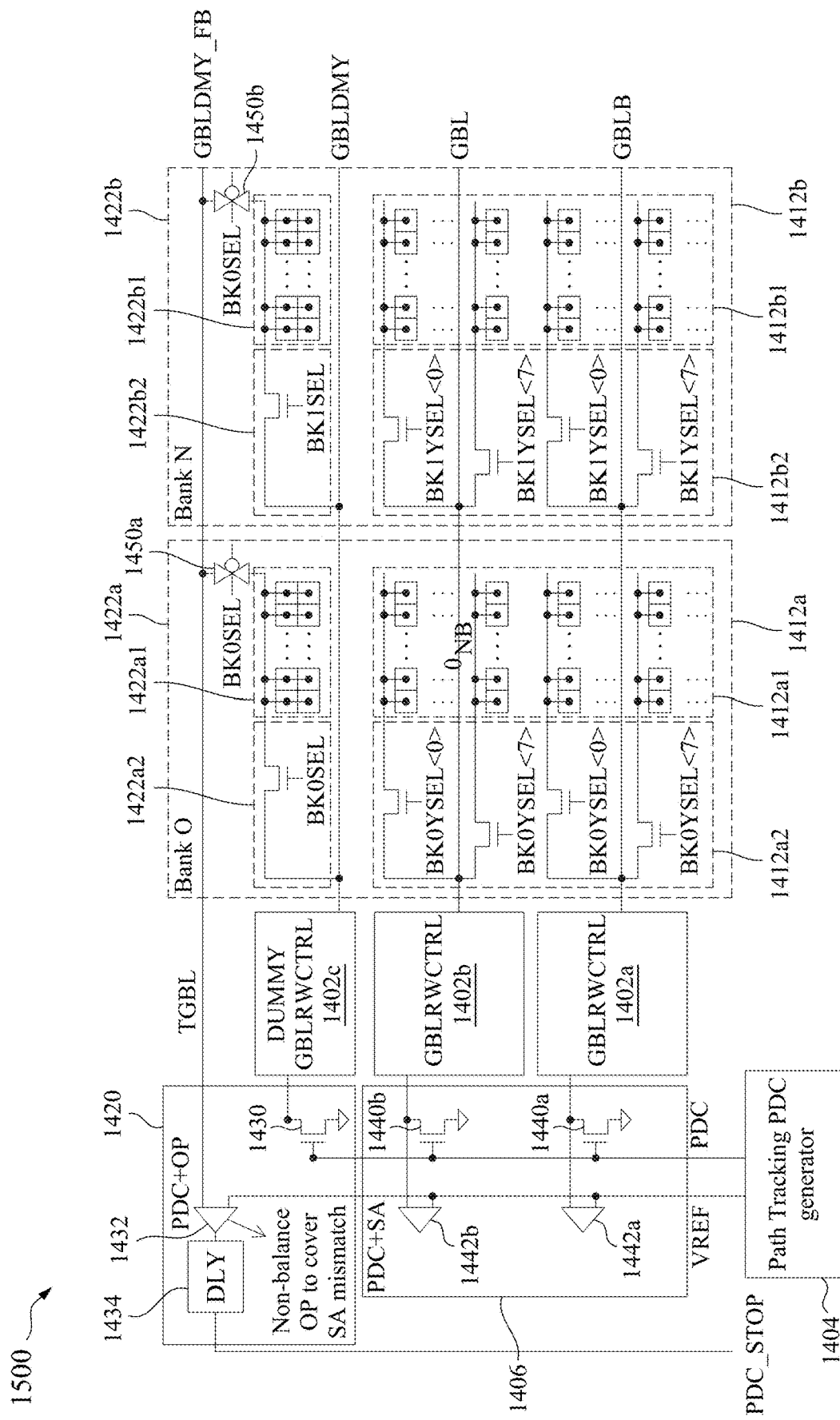
FIG. 15 is a block diagram of a memory circuit, in accordance with some embodiments.

Array partition 1412a includes memory banks 1412a1 (shown in FIG. 15) and a BL selection circuit 1412a2 (shown in FIG. 15). Memory bank 1412a1 includes a memory cell array.

Array partition 1412b includes memory banks 1412b1 (shown in FIG. 15) and a BL selection circuit 1412b2 (shown in FIG. 15). Memory bank 1412b1 includes a memory cell array.

SA/MUX 1420 is a sense amplifier and multiplexer coupled to read control circuit 1402, PDC generator 1404, SA/MUX 1406, and tracking arrays 1422a and 1422b. SA/MUX 1420 is similar to SA/MUX 1406, and similar detailed description is therefore omitted. In some embodiments, SA/MUX 1420 is a sense amplifier and multiplexer used to track the dummy global bit line GBLDMY.

SA/MUX 1420 is configured to receive the pre-discharge control signal PDC from read control circuit 1402. SA/MUX 1420 is configured to receive a tracking bit line voltage TGBL from tracking arrays 1422a and 1422b. SA/MUX 1420 is configured to generate a control signal PDC_STOP in response to at least the pre-discharge control signal PDC or tracking bit line voltage TGBL. SA/MUX 1420 is configured to output the control signal PDC_STOP to at least the read control circuit 1402.

In some embodiments, control signal PDC_STOP is useable by read control circuit 1402 and PDC generator 1404 for determining a difference between the discharge speed of the global bit line GBL or global bit line GBLB and the dummy global bit line GBLDMY. In some embodiments, control signal PDC_STOP is useable by read control circuit 1402 and PDC generator 1404 for determining a trailing edge of the pre-discharge control signal PDC. In some embodiments, a leading edge and the trailing edge of the pre-discharge control signal PDC define the pulse width of the pre-discharge control signal PDC.

In some embodiments, SA/MUX 1420 includes a sense amplifier, similar to at least circuit 400, 500, 600, 700, 900, 1100, 1200 or 1300, and is tolerant to variations of the pulse discharge control (PDC), and similar detailed description is therefore omitted.

In some embodiments, SA/MUX 1420 includes a comparator 1432 (shown in FIG. 15) similar to comparator 406 of circuit 400, 500, 600, 700 or comparator 906a, or 906b, and similar detailed description is therefore omitted. In some embodiments, comparator 1432 (shown in FIG. 15) is an un-balanced comparator configured to overcome sense amplifier mismatch from process, voltage and temperature (PVT) variations associated with array partitions 1412a and 1412b and tracking arrays 1422a and 1422b.

In some embodiments, SA/MUX 1420 is a level-aware sense amplifier configured to compare the discharge voltage of the global dummy bit line GBLDMY of dummy memory cells in tracking arrays 1422a and 1422b with a reference voltage VREF (FIG. 15) to evaluate a pre-discharge time in one or more dummy cells in tracking arrays 1422a and 1422b.

Tracking arrays 1422a and tracking array 1422b are coupled to the SA/MUX 1420 by the global dummy bit line GBLDMY. Tracking array 1422a is similar to array partition 1412a, and similar detailed description is therefore omitted. Tracking array 1422a is an array of dummy memory cells configured to track array partition 1412a. Tracking array 1422a is configured to track process, voltage and temperature (PVT) variations of one or more memory cells in array partition 1412a. In some embodiments, tracking array 1422a is configured to track the discharge of the current or voltage of the global bit line GBL and the global bit line bar GBLB in array partition 1412a thereby simulating BL loading for pre-discharge time tracking. In some embodiments, tracking array 1422a is configured to track the discharge of the current or voltage of the global bit line GBL and the global bit line bar GBLB in array partition 1412a during a pre-discharge phase of a read or programing operation of one or more memory cells in array partition 1412a.

Tracking array 1422b is similar to array partition 1412b, and similar detailed description is therefore omitted. Tracking array 1422b is an array of dummy memory cells configured to track array partition 1412b. Tracking array 1422b is configured to track PVT variations of one or more memory cells in array partition 1412b. In some embodiments, tracking array 1422b is configured to track the discharge of the current or voltage of the global bit line GBL and the global bit line bar GBLB in array partition 1412b thereby simulating BL loading for pre-discharge time tracking. In some embodiments, tracking array 1422b is configured to track the discharge of the current or voltage of the global bit line GBL and the global bit line bar GBLB in array partition 1412b during a pre-discharge phase of a read or programing operation of one or more memory cells in array partition 1412b.

In some embodiments, tracking array 1422a and 1422b are configured to track multiple rows or columns of array partitions 1412a and 1412b, thereby covering each of the PVT variations of one or more memory cells in array partitions 1412a and 1412b. In some embodiments, by being positioned at one or more end-points of memory circuit 1400, tracking arrays 1422a and 1422b are configured to provide end-point feedback to SA/MUX 1420 to thereby track the routing effect of the array partitions 1412a and 1412b.

In some embodiments, PDC generator circuit 1404 is configured to track the cell loading and routing delay of array partitions 1412a and 1412b with sufficient PVT variations, and the device propagation delay of each of the devices in memory circuit 1400 are considered with sufficient PVT variations thereby resulting in a memory circuit 1400 having better pre-discharge and read performance compared with other approaches.

In some embodiments, by at least tracking array 1422a or 1422b tracking the discharge of the current or voltage of the global bit line GBL and the global bit line bar GBLB in corresponding array partition 1412a or 1412b during the pre-discharge phase of a read or programing operation, results in circuit 1400 having better pre-discharge and read performance compared with other approaches.

FIG. 15 is a block diagram of a memory circuit 1500, in accordance with some embodiments.

FIG. 15 is simplified for the purpose of illustration. In some embodiments, memory circuit 1500 includes various elements in addition to those depicted in FIG. 15 or is otherwise arranged so as to perform the operations discussed below.

Memory circuit 1500 is an embodiment of memory circuit 1400, and similar detailed description is therefore omitted. In comparison with memory circuit 1400 of FIG. 14, memory circuit 1500 does not include pre-decoder 1408 and partition decoders 1410a and 1410b.

Memory circuit 1500 is an embodiment of a portion of memory circuit 100 of FIG. 1, and similar detailed description is therefore omitted. For example, memory circuit 1500 is an embodiment of at least memory partition 102A and 102B of FIG. 1, and similar detailed description is therefore omitted.

Memory circuit 1500 includes read control circuits 1402a, 1402b and 1402c, PDC generator circuit 1404, SA/MUX 1406, array partition 1412a, array partition 1412b, SA/MUX 1420, tracking array 1422a and tracking array 1422b.

In some embodiments, each of read control circuit 1402a, 1402b and 1402c corresponds to read control circuit 1402 of FIG. 14, and similar detailed description is therefore omitted.

Array partition 1412a includes memory cell array 1412a1 and BL selection circuit 1412a2. Memory cell array 1412a1 corresponds to memory cell array 110AR of FIG. 1, and BL selection circuit 1412a2 corresponds to BL selection circuit 110BS of FIG. 1, and similar detailed description is therefore omitted.

Array partition 1412b includes memory cell array 1412b1 and BL selection circuit 1412b2. Memory cell array 1412b1 corresponds to memory cell array 110AR of FIG. 1, and BL selection circuit 1412b2 corresponds to BL selection circuit 110BS of FIG. 1, and similar detailed description is therefore omitted.

Array partitions 1412*a* and 1412*b* are coupled to read control circuit 1402*a* by global bit line GBL. Array partitions 1412*a* and 1412*b* are coupled to read control circuit 1402*b* by global bit line bar GBLB.

Memory cell array 1412*a*1 is coupled to read control circuits 1402*a* and 1402*b* by BL selection circuit 1422*a*2 and corresponding global bit line GBL and global bit line bar GBLB.

Memory cell array 1412*b*1 is coupled to read control circuits 1402*a* and 1402*b* by BL selection circuit 1422*b*2 and corresponding global bit line GBL and global bit line bar GBLB.

Tracking array 1422*a* includes dummy memory cell array 1422*a*1 and BL selection circuit 1422*a*2. Dummy memory cell array 1422*a*1 is similar to memory cell array 1412*a*1 or memory cell array 110AR of FIG. 1, and BL selection circuit 1422*a*2 is similar to BL selection circuit 1412*a*2 or BL selection circuit 110BS of FIG. 1, and similar detailed description is therefore omitted.

Tracking array 1422*b* includes dummy memory cell array 1422*b*1 and BL selection circuit 1422*b*2. Dummy memory cell array 1422*b*1 is similar to memory cell array 1412*b*1 or memory cell array 110AR of FIG. 1, and BL selection circuit 1422*b*2 is similar to BL selection circuit 1412*b*2 or BL selection circuit 110BS of FIG. 1, and similar detailed description is therefore omitted.

Dummy memory cell arrays 1422*a*1 and 1422*b*1 are coupled to read control circuit 1402*c* by corresponding BL selection circuits 1422*a*2 and 1422*b*2 and dummy global bit line GBLDMY. BL selection circuits 1422*a*2 and 1422*b*2 are electrically coupled to read control circuit 1402*c* by dummy global bit line GBLDMY. BL selection circuits 1422*a*2 and 1422*b*2 are configured to electrically couple corresponding dummy memory cell arrays 1422*a*1 and 1422*b*1 and dummy global bit line GBLDMY in response to corresponding bank selections signals BK0SEL and BK1SEL.

Dummy memory cell arrays 1422*a*1 and 1422*b*1 are coupled to dummy global bit line GBLDMY_FB by corresponding transmission gates 1450*a* and 1450*b*. Transmission gates 1450*a* and 1450*b* are configured to electrically couple corresponding dummy memory cell arrays 1422*a*1 and 1422*b*1 and dummy global bit line GBLDMY_FB in response to corresponding bank selections signals BK0SEL and BK1SEL.

SA/MUX 1406 includes NMOS transistors 1440*a* and 1440*b* and comparators 1442*a* and 1442*b*. In some embodiments, comparators 1442*a* and 1442*b* correspond to comparator 406 of FIGS. 4-7C or comparator 906*a* or 906*b* of FIGS. 9 & 11-13, and similar detailed description is therefore omitted. In some embodiments, NMOS transistors 1440*a* and 1440*b* correspond to NMOS transistor 702 of FIGS. 7A-7C, and similar detailed description is therefore omitted.

NMOS transistors 1440*a* and 1440*b* are coupled to PDC generator circuit 1404 and the corresponding global bit line GBL and global bit line bar GBLB. NMOS transistors 1440*a* and 1440*b* are configured to discharge the corresponding global bit line GBL and global bit line bar GBLB towards reference voltage VSS in response to the pre-discharge control signal PDC.

Comparators 1442*a* and 1442*b* are coupled to the corresponding global bit line GBL and global bit line bar GBLB. Comparators 1442*a* and 1442*b* are configured to sense changes of the voltage of the corresponding global bit line GBL and global bit line bar GBLB. Comparators 1442*a* and 1442*b* are configured to compare the corresponding voltage of the corresponding global bit line GBL and global bit line bar GBLB and the reference voltage VREF, similar to comparator 406 of FIGS. 4-7C or comparator 906*a* or 906*b* of FIGS. 9 & 11-13, and similar detailed description is therefore omitted.

SA/MUX 1420 includes an NMOS transistor 1430, a comparator 1432 and a delay circuit 1434. In some embodiments, comparator 1432 corresponds to comparator 406 of FIGS. 4-7C or comparator 906*a* or 906*b* of FIGS. 9 & 11-13, and similar detailed description is therefore omitted. In some embodiments, NMOS transistor 1430 corresponds to NMOS transistor 702 of FIGS. 7A-7C, and similar detailed description is therefore omitted.

NMOS transistor 1430 is coupled to PDC generator circuit 1404 and dummy global bit line GBLDMY. NMOS transistor 1430 is configured to discharge the voltage of the dummy global bit line GBLDMY towards reference voltage VSS in response to the pre-discharge control signal PDC.

Comparator 1432 is coupled to the dummy global bit line GBLDMY_FB and a delay circuit 1434. Comparator 1432 is configured to track or sense changes of the voltage TGBL of the dummy global bit line GBLDMY_FB in response to changes of the voltage of the dummy global bit line GBLDMY. For example, in some embodiments, in response to NMOS transistor 1430 discharging the voltage of the dummy global bit line GBLDMY towards reference voltage VSS, the voltage of the dummy global bit line GBLDMY_FB will also be discharged towards reference voltage VSS, but through paths in corresponding tracking arrays 1422*a* and 1422*b*. Comparator 1432 is configured to sense changes of the voltage of the dummy global bit line GBLDMY_FB in response to changes of the voltage of the dummy global bit line GBLDMY by paths in corresponding tracking arrays 1422*a* and 1422*b*. Thus, PVT variations of tracking arrays 1422*a* and 1422*b* are sensed by comparator 1432. In some embodiments, the paths in the corresponding tracking arrays 1422*a* and 1422*b* are positioned at the end-points of the corresponding tracking arrays 1422*a* and 1422*b* (e.g., furthest from NMOS transistor 1430.)

Comparator 1432 is configured to compare the corresponding voltage TGBL of the dummy global bit line GBLDMY_FB and the reference voltage VREF, similar to comparator 406 of FIGS. 4-7C or comparator 906*a* or 906*b* of FIGS. 9 & 11-13, and similar detailed description is therefore omitted.

SA/MUX 1420 outputs a comparison of the voltage TGBL of the dummy global bit line GBLDMY_FB and the reference voltage VREF to the delay circuit 1434.

Delay circuit 1434 is configured to output the control signal PDC_STOP. In some embodiments, the delay circuit is configured to add a delay to the control signal PDC_STOP. Delay circuit 1434 is coupled between SA/MUX 1420 and PDC generator circuit 1404. Delay circuit 1434 is configured to generate the control signal PDC_STOP in response to the comparison of the voltage TGBL of the dummy global bit line GBLDMY_FB and the reference voltage VREF. In some embodiments, the delay added by delay circuit 1434 is increased or decreased thereby increasing or decreasing the pulse width of pre-discharge control signal PDC. In some embodiments, the delay circuit 1434 includes a plurality of inverters coupled in series or a buffer circuit. In some embodiments, the delay circuit 1434 is not included in FIG. 15.

In some embodiments, memory circuit 1500 operates to achieve one or more benefits described herein including the details discussed above with respect to memory circuit 1400.

Figure 16:
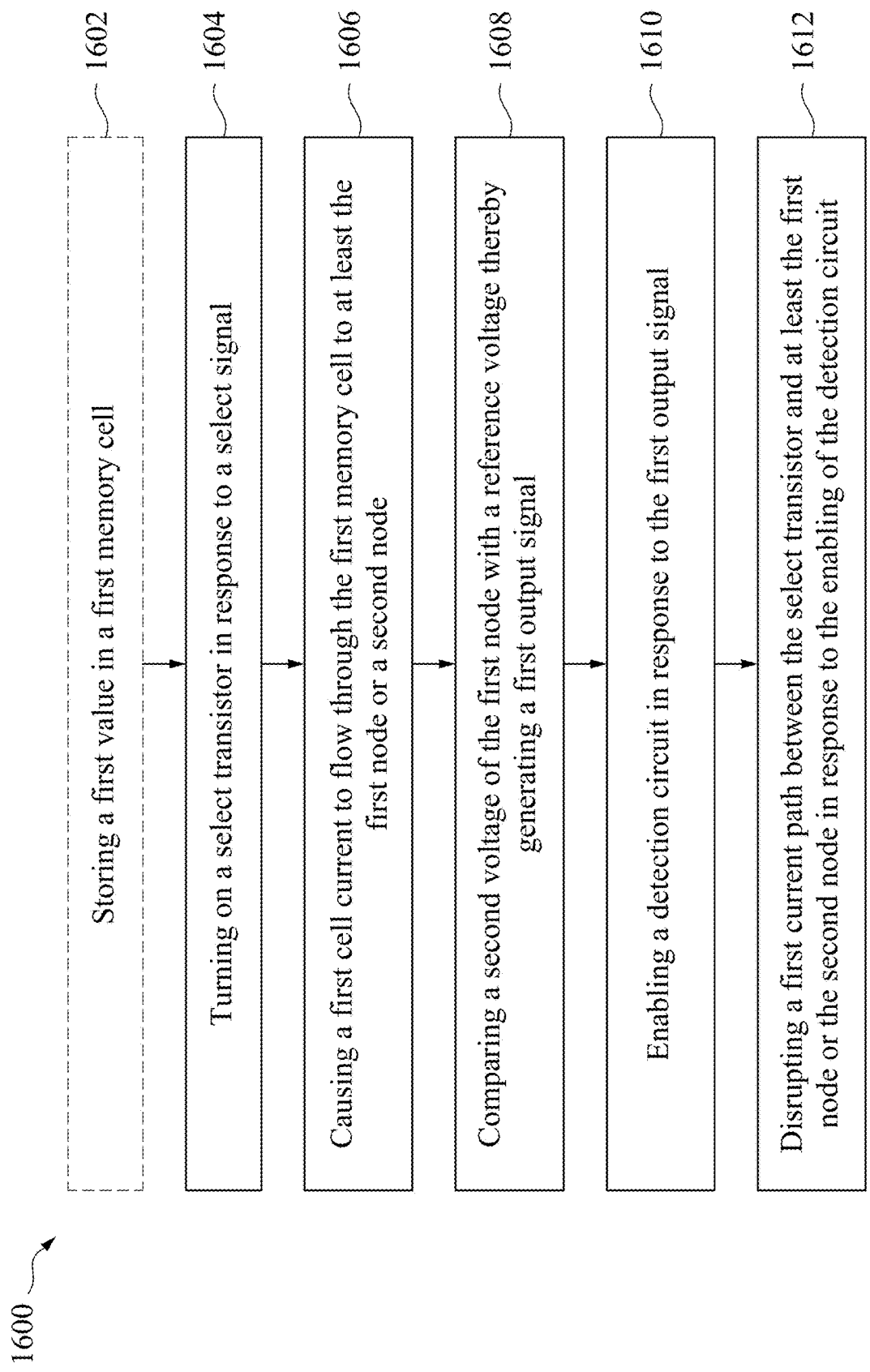
FIG. 16 is a flowchart of a method of operating a circuit, in accordance with some embodiments.

FIG. 16 is a flowchart of a method 1600 of operating a circuit, in accordance with some embodiments.

In some embodiments, FIG. 16 is a flowchart of a method of operating the memory circuit of FIG. 1 or 2 or the circuit of FIGS. 4-7C, 9 or 11-15.

It is understood that additional operations may be performed before, during, and/or after the method 1600 depicted in FIG. 16, and that some other operations may only be briefly described herein. It is understood that method 1600 utilizes features of one or more of circuits 100, 200, 300, 400, 500, 600, 700, 900, 1100, 1200, 1300, 1400 or 1500, or one or more of waveforms 800 or 1000, and similar detailed description is omitted for brevity.

In some embodiments, other order of operations of method 1600 is within the scope of the present disclosure. Method 1600 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1600 is not performed.

In operation 1602 of method 1600, a first value is stored in a first memory cell. In some embodiments, the first memory cell of method 1600 includes at least memory cell 300, 402, 902a or 902b. In some embodiments, the first value of method 1600 includes at least logic 0 or logic 1.

In operation 1604 of method 1600, a select transistor is turned on in response to a select signal SEL. In some embodiments, the select transistor of method 1600 includes at least NMOS transistor N1, N3a or N3b. In some embodiments, the select transistor is coupled between the first memory cell and a first node. In some embodiments, the first node of method 1600 includes at least node Nd3, Nd4a or Nd4b.

In operation 1606 of method 1600, causing a first cell current Icell to flow through the first memory cell to at least the first node in response to a first voltage being applied to a first word line of the first memory cell.

In some embodiments, the first voltage of method 1600 includes at voltage VDD. In some embodiments, the first word line of method 1600 includes at least word line WL. In some embodiments, the second node of method 1600 includes at least node Nd5, Nd5a or Nd5b.

In operation 1608 of method 1600, comparing, by a comparator, a second voltage of the first node with a reference voltage VREF thereby generating a first output signal.

In some embodiments, the second voltage of method 1600 includes at least voltage VDL, DL or DLB. In some embodiments, the comparator of method 1600 includes at least comparator 406, 906a, 906b, 1442a, 1442b or 1432. In some embodiments, the first output signal of method 1600 includes at least output signal SA_OUT, SA_OUTB, SA_OUT1, SA_OUTB1, OP_OUT, OP_OUTB or signal C1.

In operation 1610 of method 1600, a detection circuit is enabled in response to the first output signal. In some embodiments, the detection circuit of method 1600 includes at least detection circuit 408, 508, 608, 1108a, 1108b, 1208a, 1208b, 1308a or 1308b. In some embodiments, the detection circuit of method 1600 includes at least SA/MUX 1420.

In operation 1612 of method 1600, a first current path between the select transistor and at least the first node or a second node is disrupted in response to the enabling of the detection circuit.

In some embodiments, the first current path of method 1600 includes at least a circuit path through at least NMOS transistor N1, N3a or N3b. In some embodiments, the first current path of method 1600 is between the first memory cell and the first node. In some embodiments, the first current path of method 1600 is between the first memory cell and the second node.

In some embodiments, operation 1612 further comprises generating, by an inverter (e.g., inverter I1, I1a or I1b), an inverted first output signal (e.g., signal SOB1, S1a or S1b), turning on a first transistor (e.g., PMOS transistor P1, P2, P1a, P1b, P2a or P2b) in response to the inverted first output signal, pulling the second voltage of the first node to the first voltage in response to the first transistor turning on, and turning off the select transistor in response to pulling the second voltage of the first node to the first voltage. In some embodiments, the first transistor is coupled to the first node.

In some embodiments, method 1600 further comprises resetting the detection circuit in response to a reset signal RESET, and generating, by a flip-flop, a second output signal and an inverted second output signal. In some embodiments, the second output signal of method 1600 includes at least output signal SA_OUT, SA_OUTB, OP_OUT or OP_OUTB. In some embodiments, the inverted second output signal of method 1600 includes at least output signal SA_OUT, SA_OUTB, OP_OUT or OP_OUTB.

In some embodiments, operation 1612 further comprises triggering the flip-flop in response to a transition of the first output signal (e.g., signal C1, C1a or C1b) from a first level (logic 0 or 1) to a second level (logic 1 or 0), causing the flip-flop to generate a latched data signal (e.g., IN1) as the second output signal, and turning off a first transistor (e.g., NMOS transistor N2, N2a or N2b) in response to an inverted latched data signal (e.g., SOB), the first transistor being coupled between the first node and the second node.

In some embodiments, operation 1612 further comprises turning on a second transistor (e.g., PMOS transistor P2, P2a or P2b) in response to the inverted latched data signal, pulling the second voltage of the first node to the first voltage in response to the second transistor turning on, and turning off the select transistor in response to pulling the second voltage of the first node to the first voltage. In some embodiments, the second transistor is coupled to the first node.

By operating method 1600, the memory circuit operates to achieve the benefits discussed above with respect to memory circuit 100-200, or circuit 400-700, 900 or 1100-1400 or waveforms 800 or 1000. While method 1600 was described above reference to at least with portions of FIGS. 4-7C, 9 and 11-13, it is understood that method 1600 utilizes the features of one or more of FIGS. 14-15.

In some embodiments, one or more of the operations of method 1600 is not performed. Furthermore, various PMOS or NMOS transistors shown in FIGS. 3-15 are of a particular dopant type (e.g., N-type or P-type) are for illustration purposes. Embodiments of the disclosure are not limited to a particular transistor type, and one or more of the PMOS or NMOS transistors shown in FIGS. 3-15 can be substituted with a corresponding transistor of a different transistor/ dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in FIGS. 3-15 is within the scope of various embodiments. Selecting different numbers of transistors in FIG. 3-15 is within the scope of various embodiments.

Selecting different numbers of NAND logic gates in FIG. 3-15 is within the scope of various embodiments.

FIG. 17A is a block diagram of a PDC generator circuit 1700A, in accordance with some embodiments.

FIG. 17A is simplified for the purpose of illustration. In some embodiments, PDC generator circuit 1700A includes various elements in addition to those depicted in FIG. 17A or is otherwise arranged so as to perform the operations discussed below.

PDC generator circuit 1700A is an embodiment of PDC generator circuit 1404 of FIGS. 14-15, and similar detailed description is therefore omitted.

PDC generator circuit 1700A includes a flip-flop 1702 and an inverter 1704.

Inverter 1704 is coupled to flip-flop 1702. Inverter 1704 is configured to generate read enable signal READENB in response to read enable signal READEN. In some embodiments, read enable signal READENB is inverted from read enable signal READEN, and vice versa.

An input terminal of inverter 1704 is configured to receive read enable signal READEN. An output terminal of inverter 1704 is coupled to a set terminal SET of flip-flop 1702. The output terminal of inverter 1704 is configured to output read enable signal READENB.

Flip-flop 1702 is configured to receive control signal PDC_STOP, read enable signal READENB and a data signal Din. Flip-flop 1702 is configured to generate pulse control signal PDC in response to at least control signal PDC_STOP, read enable signal READENB or data signal Din.

Flip-flop 1702 is a DQ flip-flop. In some embodiments, flip-flop 1702 includes an SR-flip-flop, a T flip-flop, a JK flip-flop, or the like. Other types of flip-flops or configurations for at least flip-flop 1702 are within the scope of the present disclosure.

Flip-flop 1702 has a clock input terminal CLK, a data input terminal D, a set terminal SET, and an output terminal Q.

In some embodiments, the clock input terminal CLK is coupled to an output terminal of delay circuit 1434 of FIG. 15. The clock input terminal CLK is configured to receive control signal PDC_STOP from the delay circuit 1434. In some embodiments, flip-flop 1702 is a positive edge triggered flip-flop, and a transition of control signal PDC_STOP from logic 0 to logic 1 will cause the flip-flop 1702 to latch the data signal Din received on the data input terminal D. In some embodiments, flip-flop 1702 is a negative edge triggered flip-flop.

The data input terminal D is configured to receive a data signal Din. The data signal Din is a logic 0. In some embodiments, the data signal Din is a logic 1. The data input terminal D is coupled to a source (not shown) of the data signal Din. In some embodiments, the data input terminal D is coupled to the reference voltage supply node VSSN.

The output terminal Q is configured to output the pulse control signal PDC. In some embodiments, the output terminal Q is coupled to NMOS transistors 1430, 1440a and 1440b of FIG. 15.

The set terminal SET is configured to receive the read enable signal READENB. In some embodiments, the read enable signal READENB is configured to set flip-flop 1702. In some embodiments, flip-flop 1702 is set in response to the read enable signal READENB being a logic 1. In some embodiments, in response to flip-flop 1702 being set, flip-flop 1702 ignores the data signal Din received on the data input terminal D, and the pulse control signal PDC of flip-flop 1702 is set as a logic 1. In some embodiments, flip-flop 1702 is reset in response to the read enable signal READENB being a logic 0.

FIG. 17B is a timing diagram 1700B of waveforms of PDC generator circuit 1700A, in accordance with some embodiments.

In some embodiments, FIG. 17B is a timing diagram 1700B of waveforms of at least PDC generator circuit 1404 in FIGS. 14-15, in accordance with some embodiments.

In the timing diagram 1700B of FIG. 17B, data signal Din is a logic 0. In some embodiments, data signal Din is a logic 1.

Prior to time T1, read enable signal READEN and control signal PDC_STOP are both logic 0, and pulse control signal PDC is logic 1. In response to read enable signal READEN being logic 0, read enable signal READENB is logic 1, flip-flop 1702 is in a SET state, and the output Q (e.g., pulse control signal PDC) of flip-flop 1702 is set to logic 1.

At time T1, read enable signal READEN transitions from logic 0 to logic 1 causing read enable signal READENB to transition from logic 1 to logic 0 by inverter 1704. In response to read enable signal READENB being logic 0, flip-flop 1702 is no longer in a SET state, and changes on the clock input terminal CLK of flip-flop 1702 can now cause changes on the output terminal Q of flip-flop 1702.

At time T2, control signal PDC_STOP transitions from logic 0 to logic 1.

At time T3, in response to control signal PDC_STOP transitioning from logic 0 to logic 1 (e.g., rising edge of clock signal), the pulse control signal PDC adopts the value of data signal Din (e.g., logic 0), and transitions from logic 1 to logic 0. In some embodiments, time T2 is equal to time T3, and flip-flop 1702 does not have a delay in response to the transition of control signal PDC_STOP on the clock input terminal CLK.

At time T4, read enable signal READEN transitions from logic 1 to logic 0 causing read enable signal READENB to transition from logic 0 to logic 1 by inverter 1704. In response to read enable signal READENB being logic 1, causes flip-flop 1702 to enter the SET state which causes the output Q (e.g., pulse control signal PDC) of flip-flop 1702 to transition from logic 0 to logic 1.

At time T4, control signal PDC_STOP transitions from logic 1 to logic 0. In some embodiments, since flip-flop 1702 enters the SET state, changes on the clock input terminal CLK of flip-flop 1702 will not cause changes on the output terminal Q of flip-flop 1702.

Other waveforms of PDC generator circuit 1700A or timing diagrams 1700B are within the scope of the present disclosure.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. The memory circuit includes a non-volatile memory cell, a sense amplifier coupled to the non-volatile memory cell, and configured to generate a first output signal, and a detection circuit coupled to the sense amplifier and the non-volatile memory cell. The detection circuit is configured to latch the first output signal and disrupt a current path between the non-volatile memory cell and the sense amplifier. In some embodiments, the non-volatile memory cell includes a first transistor including a first gate, a first drain, and a first source, wherein the first gate is coupled to a program word line; and a second transistor including a second gate, a second drain, and a second source, wherein the second gate is coupled to a read word line, the second drain is coupled to the first source, and the second source is coupled to the sense amplifier. In some embodiments, the sense amplifier includes a comparator including a first input terminal, a second input terminal and a first output terminal, the first input terminal being coupled to the non-volatile memory cell by a first node, and being configured to receive a first voltage, the second input terminal being configured to receive a second voltage, the first output terminal being configured to output the first output signal. In some embodiments, the sense amplifier further includes a first current source having a first end and a second end, the first end of the first current source being coupled to the first node, the first input terminal of the comparator and the non-volatile memory cell, and the second end of the first current source being coupled to a first voltage supply. In some embodiments, the detection circuit includes a first inverter including a first input terminal of the first inverter coupled to the first output terminal of the comparator and configured to receive the first output signal, and a first output terminal of the first inverter configured to generate an inverted first output signal. In some embodiments, the detection circuit further includes a third transistor including a third gate, a third drain, and a third source, wherein the third gate of the third transistor is coupled to the first output terminal of the first inverter and configured to receive the inverted first output signal, the third source of the third transistor is coupled to a second voltage supply different from the first voltage supply, and the third drain of the third transistor is coupled to the first node, the first input terminal of the comparator, the non-volatile memory cell and the first end of the first current source, wherein the first output signal corresponds to data stored in the non-volatile memory cell. In some embodiments, the third transistor is configured to set a voltage of the first node to a voltage of the first voltage supply in response to the inverted first output signal, and in response to the voltage of the first node being the voltage of the first voltage supply, turning off the second transistor. In some embodiments, the detection circuit includes a flip-flop including a first input terminal of the flip-flop coupled to the first output terminal of the comparator and configured to receive the first output signal, a second input terminal of the flip-flop configured to receive a first data signal, a third input terminal of the flip-flop configured to receive a first reset signal, a first output terminal of the flip-flop configured to generate a second output signal, and a second output terminal of the flip-flop configured to generate an inverted second output signal. In some embodiments, the detection circuit further includes a third transistor including a third gate, a third drain, and a third source, wherein the third gate of the third transistor is coupled to the second output terminal of the flip-flop and configured to receive the inverted second output signal, the third source of the third transistor is coupled to a second node, and the third drain of the third transistor is coupled to the first node, the first input terminal of the comparator and the non-volatile memory cell, wherein the second output signal corresponds to data stored in the non-volatile memory cell. In some embodiments, the sense amplifier further includes a first current source having a first end and a second end, the first end of the first current source being coupled to the second node and the third source of the third transistor, the first input terminal of the comparator and the non-volatile memory cell, and the second end of the first current source being coupled to a first voltage supply. In some embodiments, the detection circuit further includes a fourth transistor including a fourth gate, a fourth drain, and a fourth source, wherein the fourth gate of the fourth transistor is coupled to the second output terminal of the flip-flop and configured to receive the inverted second output signal, the fourth source of the fourth transistor is coupled to a second voltage supply different from the first voltage supply, and the fourth drain of the fourth transistor is coupled to the first node, the first input terminal of the comparator and the non-volatile memory cell.

Another aspect of this description relates to a memory circuit. The memory circuit includes a first non-volatile memory cell configured to store a first value, a second non-volatile memory cell configured to store a second value inverted from the first value, a first sense amplifier coupled to the first non-volatile memory cell, and configured to generate a first output signal, a second sense amplifier coupled to the second non-volatile memory cell, and configured to generate a second output signal, and a latch coupled to the first sense amplifier and the second sense amplifier, and configured to latch the first output signal and the second output signal. In some embodiments, the latch includes a first NAND logic gate including a first input terminal, a second input terminal and a first output terminal, the first input terminal of the first NAND logic gate being coupled to the first sense amplifier, and being configured to receive the first output signal, and the first output terminal of the first NAND logic gate being configured to output a first NAND output signal. In some embodiments, the latch further includes a second NAND logic gate including a first input terminal, a second input terminal and a first output terminal, the first input terminal of the second NAND logic gate being coupled to the first sense amplifier, and being configured to receive the second output signal, and the first output terminal of the second NAND logic gate being configured to output a second NAND output signal. In some embodiments, the second input terminal of the first NAND logic gate is coupled to the first output terminal of the second NAND logic gate, and is configured to receive the second NAND output signal, and the second input terminal of the second NAND logic gate is coupled to the first output terminal of the first NAND logic gate, and is configured to receive the first NAND output signal. In some embodiments, the latch further includes a first inverter including a first input terminal of the first inverter coupled to the first output terminal of the first NAND logic gate and configured to receive the first NAND output signal, and a first output terminal of the first inverter configured to generate an inverted first NAND output signal. In some embodiments, the latch further includes a second inverter including a first input terminal of the second inverter coupled to the first output terminal of the second NAND logic gate and configured to receive the second NAND output signal, and a first output terminal of the second inverter configured to generate an inverted second NAND output signal. In some embodiments, the inverted first NAND output signal corresponds to the first value stored in the first non-volatile memory cell, and the inverted second NAND output signal corresponds to the second value stored in the second non-volatile memory cell. In some embodiments, the first sense amplifier includes a first comparator including a first input terminal, a second input terminal and a first output terminal, the first input terminal of the first comparator being coupled to the first non-volatile memory cell by a first node, and being configured to receive a first voltage, the second input terminal of the first comparator being configured to receive a reference voltage, the first output terminal of the first comparator being configured to output the first output signal.

In some embodiments, the first sense amplifier further includes a first current source having a first end and a second end, the first end of the first current source being coupled to the first node, the first input terminal of the first comparator and the first non-volatile memory cell, and the second end of the first current source being coupled to a first voltage supply. In some embodiments, the second sense amplifier includes a second comparator including a first input terminal, a second input terminal and a first output terminal, the first input terminal of the second comparator being coupled to the second non-volatile memory cell by a second node, and being configured to receive a second voltage, the second input terminal of the second comparator being configured to receive a reference voltage, the first output terminal of the second comparator being configured to output the second output signal. In some embodiments, the second sense amplifier further includes a second current source having a first end and a second end, the first end of the second current source being coupled to the second node, the first input terminal of the second comparator and the second non-volatile memory cell, and the second end of the second current source being coupled to the first voltage supply. In some embodiments, the memory circuit further includes a first detection circuit coupled to the first sense amplifier and the first non-volatile memory cell, the first detection circuit configured to latch the first output signal and disrupt a first current path between the first non-volatile memory cell and the first sense amplifier. In some embodiments, the memory circuit further includes a second detection circuit coupled to the second sense amplifier and the second non-volatile memory cell, the second detection circuit configured to latch the second output signal and disrupt a second current path between the second non-volatile memory cell and the second sense amplifier. In some embodiments, the first detection circuit includes a first inverter including a first input terminal of the first inverter coupled to the first output terminal of the first comparator and configured to receive the first output signal, and a first output terminal of the first inverter configured to generate an inverted first output signal. In some embodiments, the first detection circuit further includes a first transistor including a first gate, a first drain, and a first source, wherein the first gate of the first transistor is coupled to the first output terminal of the first inverter and configured to receive the inverted first output signal, the first source of the first transistor is coupled to a second voltage supply different from the first voltage supply, and the first drain of the first transistor is coupled to the first node, the first input terminal of the first comparator, the first non-volatile memory cell and the first end of the first current source. In some embodiments, the second detection circuit includes a second inverter including a first input terminal of the second inverter coupled to the first output terminal of the second comparator and configured to receive the second output signal, and a first output terminal of the second inverter configured to generate an inverted second output signal. In some embodiments, the second detection circuit further includes a second transistor including a second gate, a second drain, and a second source, wherein the second gate of the second transistor is coupled to the first output terminal of the second inverter and configured to receive the inverted second output signal, the second source of the second transistor is coupled to the second voltage supply, and the second drain of the second transistor is coupled to the second node, the first input terminal of the second comparator, the second non-volatile memory cell and the first end of the second current source.

Still another aspect of this description relates to a method of operating a memory circuit. The method includes storing a first value in a first memory cell, turning on a select transistor in response to a select signal, the select transistor being coupled between the first memory cell and a first node, applying a first voltage to a first word line of the first memory cell thereby causing a first cell current to flow through the first memory cell to at least the first node, comparing, by a comparator, a second voltage of the first node with a reference voltage thereby generating a first output signal, enabling a detection circuit in response to the first output signal, and disrupting a first current path between the select transistor and at least the first node or a second node in response to the enabling of the detection circuit. In some embodiments, disrupting the first current path between the select transistor and at least the first node or the second node includes generating, by an inverter, an inverted first output signal; turning on a first transistor in response to the inverted first output signal, the first transistor being coupled to the first node; pulling the second voltage of the first node to the first voltage in response to the first transistor turning on; and turning off the select transistor in response to pulling the second voltage of the first node to the first voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a non-volatile memory cell;
   a sense amplifier coupled to the non-volatile memory cell, and configured to generate a first output signal, the sense amplifier comprising:
   a comparator comprising a first input terminal, a second input terminal and a first output terminal, the first input terminal being coupled to the non-volatile memory cell by a first node, and being configured to receive a first voltage, the second input terminal being configured to receive a second voltage, the first output terminal being configured to output the first output signal; and
   a detection circuit coupled to the sense amplifier and the non-volatile memory cell, the detection circuit configured to latch the first output signal and disrupt a current path between the non-volatile memory cell and the sense amplifier, the detection circuit comprising:
   a flip-flop comprising a first input terminal of the flip-flop coupled to the first output terminal of the comparator and configured to receive the first output signal, a second input terminal of the flip-flop configured to receive a first data signal, a third input terminal of the flip-flop configured to receive a first reset signal, a first output terminal of the flip-flop configured to generate a second output signal, and a second output terminal of the flip-flop configured to generate an inverted second output signal.

2. The memory circuit of claim 1, wherein the non-volatile memory cell comprises:
- a first transistor comprising a first gate, a first drain, and a first source, wherein the first gate is coupled to a program word line; and
- a second transistor comprising a second gate, a second drain, and a second source, wherein the second gate is coupled to a read word line, the second drain is coupled to the first source, and the second source is coupled to the sense amplifier.

3. The memory circuit of claim 1, wherein the sense amplifier further comprises:
- a first current source having a first end and a second end, the first end of the first current source being coupled to the first node, the first input terminal of the comparator and the non-volatile memory cell, and the second end of the first current source being coupled to a first voltage supply.

4. The memory circuit of claim 1, wherein the detection circuit further comprises:
- a first transistor comprising a first gate, a first drain, and a first source, wherein the first gate of the first transistor is coupled to the second output terminal of the flip-flop and configured to receive the inverted second output signal, the first source of the first transistor is coupled to a second node, and the first drain of the first transistor is coupled to the first node, the first input terminal of the comparator and the non-volatile memory cell,
- wherein the second output signal corresponds to data stored in the non-volatile memory cell.

5. The memory circuit of claim 4, wherein the sense amplifier further comprises:
- a first current source having a first end and a second end, the first end of the first current source being coupled to the second node and the first source of the first transistor, and the second end of the first current source being coupled to a first voltage supply.

6. The memory circuit of claim 5, wherein the detection circuit further comprises:
- a second transistor comprising a second gate, a second drain, and a second source, wherein the second gate of the second transistor is coupled to the second output terminal of the flip-flop and configured to receive the inverted second output signal, the second source of the second transistor is coupled to a second voltage supply different from the first voltage supply, and the second drain of the second transistor is coupled to the first node, the first input terminal of the comparator and the non-volatile memory cell.

7. The memory circuit of claim 6, wherein the first transistor is a first transistor type.

8. The memory circuit of claim 7, wherein the second transistor is a second transistor type different from the first transistor type.

9. The memory circuit of claim 4, wherein the first transistor is a first transistor type.

10. The memory circuit of claim 1, wherein
- the first input terminal of the comparator is a non-inverting input terminal, and
- the second input terminal of the comparator is an inverting input terminal.

11. A memory circuit comprising:
- a first non-volatile memory cell configured to store a first value;
- a second non-volatile memory cell configured to store a second value inverted from the first value;
- a first sense amplifier coupled to the first non-volatile memory cell, and configured to generate a first output signal, the first sense amplifier comprises:
  - a first comparator comprising a first input terminal, a second input terminal and a first output terminal, the first input terminal of the first comparator being coupled to the first non-volatile memory cell by a first node, and being configured to receive a first voltage, the second input terminal of the first comparator being configured to receive a reference voltage, the first output terminal of the first comparator being configured to output the first output signal;
- a second sense amplifier coupled to the second non-volatile memory cell, and configured to generate a second output signal;
- a latch coupled to the first sense amplifier and the second sense amplifier, and configured to latch the first output signal and the second output signal; and
- a first detection circuit coupled to the first sense amplifier and the first non-volatile memory cell, the first detection circuit configured to latch the first output signal and disrupt a first current path between the first non-volatile memory cell and the first sense amplifier, the first detection circuit comprising:
  - a first inverter comprising a first input terminal of the first inverter coupled to the first output terminal of the first comparator and configured to receive the first output signal, and a first output terminal of the first inverter configured to generate an inverted first output signal; and
  - a first transistor comprising a first gate, a first drain, and a first source, wherein the first gate of the first transistor is coupled to the first output terminal of the first inverter and configured to receive the inverted first output signal, the first source of the first transistor is coupled to a first voltage supply, and the first drain of the first transistor is coupled to the first node, the first input terminal of the first comparator, and the first non-volatile memory cell.

12. The memory circuit of claim 11, wherein the latch comprises:
- a first NAND logic gate comprising a first input terminal, a second input terminal and a first output terminal, the first input terminal of the first NAND logic gate being coupled to the first sense amplifier, and being configured to receive the first output signal, and the first output terminal of the first NAND logic gate being configured to output a first NAND output signal; and
- a second NAND logic gate comprising a first input terminal, a second input terminal and a first output terminal, the first input terminal of the second NAND logic gate being coupled to the second sense amplifier, and being configured to receive the second output signal, and the first output terminal of the second NAND logic gate being configured to output a second NAND output signal,
- wherein the second input terminal of the first NAND logic gate is coupled to the first output terminal of the second NAND logic gate, and is configured to receive the second NAND output signal, and
- the second input terminal of the second NAND logic gate is coupled to the first output terminal of the first NAND logic gate, and is configured to receive the first NAND output signal.

13. The memory circuit of claim 12, wherein the latch further comprises:
   a second inverter comprising a first input terminal of the second inverter coupled to the first output terminal of the first NAND logic gate and configured to receive the first NAND output signal, and a first output terminal of the second inverter configured to generate an inverted first NAND output signal; and
   a third inverter comprising a first input terminal of the third inverter coupled to the first output terminal of the second NAND logic gate and configured to receive the second NAND output signal, and a first output terminal of the third inverter configured to generate an inverted second NAND output signal,
   wherein the inverted first NAND output signal corresponds to the first value stored in the first non-volatile memory cell, and the inverted second NAND output signal corresponds to the second value stored in the second non-volatile memory cell.

14. The memory circuit of claim 11, wherein the first sense amplifier further comprises:
   a first current source having a first end and a second end, the first end of the first current source being coupled to the first node, the first input terminal of the first comparator, the first drain of the first transistor and the first non-volatile memory cell, and the second end of the first current source being coupled to a second voltage supply different from the first voltage supply.

15. The memory circuit of claim 14, wherein the second sense amplifier comprises:
   a second comparator comprising a first input terminal, a second input terminal and a first output terminal, the first input terminal of the second comparator being coupled to the second non-volatile memory cell by a second node, and being configured to receive a second voltage, the second input terminal of the second comparator being configured to receive the reference voltage, the first output terminal of the second comparator being configured to output the second output signal; and
   a second current source having a first end and a second end, the first end of the second current source being coupled to the second node, the first input terminal of the second comparator and the second non-volatile memory cell, and the second end of the second current source being coupled to the second voltage supply.

16. The memory circuit of claim 15, further comprising:
   a second detection circuit coupled to the second sense amplifier and the second non-volatile memory cell, the second detection circuit configured to latch the second output signal and disrupt a second current path between the second non-volatile memory cell and the second sense amplifier.

17. The memory circuit of claim 16, wherein the second detection circuit comprises:
   a second inverter comprising a first input terminal of the second inverter coupled to the first output terminal of the second comparator and configured to receive the second output signal, and a first output terminal of the second inverter configured to generate an inverted second output signal; and
   a second transistor comprising a second gate, a second drain, and a second source, wherein the second gate of the second transistor is coupled to the first output terminal of the second inverter and configured to receive the inverted second output signal, the second source of the second transistor is coupled to the first voltage supply, and the second drain of the second transistor is coupled to the second node, the first input terminal of the second comparator, the second non-volatile memory cell and the first end of the second current source.

18. The memory circuit of claim 17, wherein
   the first transistor is a first n-type transistor; and
   the second transistor is a second n-type transistor.

19. The memory circuit of claim 11, wherein
   the first input terminal of the comparator is a non-inverting input terminal, and
   the second input terminal of the comparator is an inverting input terminal.

20. A method of operating a memory circuit, the method comprising:
   storing a first value in a first memory cell;
   turning on a select transistor in response to a select signal, the select transistor being coupled between the first memory cell and a first node;
   applying a first voltage to a first word line of the first memory cell thereby causing a first cell current to flow through the first memory cell to at least the first node;
   comparing, by a comparator, a second voltage of the first node with a reference voltage thereby generating a first output signal;
   enabling a detection circuit in response to the first output signal; and
   disrupting a first current path between the select transistor and at least the first node or a second node in response to the enabling the detection circuit, wherein disrupting the first current path between the select transistor and at least the first node or the second node comprises:
   generating, by an inverter, an inverted first output signal;
   turning on a first transistor in response to the inverted first output signal, the first transistor being coupled to the first node;
   pulling the second voltage of the first node to the first voltage in response to the first transistor turning on; and
   turning off the select transistor in response to pulling the second voltage of the first node to the first voltage.

* * * * *